(12) United States Patent
Taoka

(10) Patent No.: US 11,330,210 B2
(45) Date of Patent: May 10, 2022

(54) METHODS AND APPARATUSES FOR PROCESSING MOVING IMAGES

(71) Applicant: Samsung Electronics Co., Ltd., Suwon-si (KR)

(72) Inventor: Mineki Taoka, Yokohama (JP)

(73) Assignee: Samsung Electronics Co., Ltd., Gyeonggi-do (KR)

(*) Notice: Subject to any disclaimer, the term of this patent is extended or adjusted under 35 U.S.C. 154(b) by 39 days.

(21) Appl. No.: 17/021,360

(22) Filed: Sep. 15, 2020

(65) Prior Publication Data

US 2021/0289153 A1    Sep. 16, 2021

(30) Foreign Application Priority Data

Mar. 11, 2020  (JP) .............................. JP2020-042011

(51) Int. Cl.
  *H04N 5/359*  (2011.01)
  *H04N 5/3745*  (2011.01)
  *H01L 27/146*  (2006.01)

(52) U.S. Cl.
  CPC ......... *H04N 5/3597* (2013.01); *H01L 27/146* (2013.01); *H04N 5/37452* (2013.01)

(58) Field of Classification Search
  CPC .. H04N 5/37452; H04N 5/3597; H04N 5/211; H04N 5/144; H04N 5/359; H04N 9/646; G06T 5/003; G06T 7/20; H01L 27/146
  See application file for complete search history.

(56) References Cited

U.S. PATENT DOCUMENTS

| | | | |
|---|---|---|---|
| 10,554,901 B2 * | 2/2020 | Kiser | G02B 27/1066 |
| 10,594,964 B2 | 3/2020 | Ono | |
| 2020/0267300 A1 * | 8/2020 | Zhen | H04N 5/23254 |

FOREIGN PATENT DOCUMENTS

| | | | |
|---|---|---|---|
| JP | 2004-073450 A | | 3/2004 |
| JP | 2008228181 A | * | 9/2008 |
| JP | 2009-254660 A | | 11/2009 |
| JP | 4700947 B2 | | 6/2011 |
| JP | 4804387 B2 | | 11/2011 |
| JP | 2017-050646 A | | 3/2017 |
| WO | WO-17130581 A1 | | 8/2017 |

* cited by examiner

*Primary Examiner* — Nelson D. Hernández Hernández
(74) *Attorney, Agent, or Firm* — Harness, Dickey & Pierce, P.L.C.

(57) ABSTRACT

A moving image processing apparatus is configured to extract position information of a saturation region from a first frame, the saturation region including pixels each having at least a threshold pixel value that is associated with an afterimage being formed in a subsequent frame elapsed from the first frame. The moving image processing apparatus is configured to extract an afterimage region corresponding to the saturation region from the second frame, calculate motion information of the afterimage region based on motion information indicating motion between a second frame and a third frame, extract a candidate region that is matched to the afterimage region in the third frame based on the motion information, and correct the afterimage region based on the candidate region data.

20 Claims, 17 Drawing Sheets

METHODS AND APPARATUSES FOR PROCESSING MOVING IMAGES

CROSS-REFERENCE TO RELATED APPLICATION

This application claims priority to and the benefit of Japanese Patent Application No. 2020-042011 filed in the Japan Patent Office on Mar. 11, 2020, the entire contents of which are incorporated herein by reference.

BACKGROUND

(a) Field

The described technology generally relates to relates to moving image processing apparatuses and moving image processing methods.

(b) Description of the Related Art

Photoelectric conversion members, using silicon as a single material, for use in digital cameras have been developed. However, when the silicon is used as the single material in a photoelectric conversion member, a band gap associated with the photoelectric conversion member is fixed (e.g., constant) and a color filter is formed only on a surface of the photoelectric conversion member. Therefore, the photoelectric conversion member using the silicon as the single material should arrange red pixels (hereinafter referred to as "R pixels"), green pixels (hereinafter referred to as "G pixels"), and blue pixels (hereinafter referred to as "B pixels") in a surface direction to perform color imaging with a single plate.

In addition, when a higher-resolution subject is imaged by using the above-described photoelectric conversion member, luminance moiré or color moiré may occur in images of the subject. Therefore, it might be necessary to mount an optical low-pass filter in an imaging apparatus in order to suppress the luminance moiré or color moiré. However, if the optical low-pass filter is mounted in the imaging apparatus, the resolution is lowered.

Accordingly, Japanese Patent No. 4700947 (hereinafter referred to as the "947 patent") discloses a method of forming a silicon film on which B pixels and R pixels are arranged using a semiconductor manufacturing process and disposing an organic photoelectric conversion film absorbing a green wavelength on an upper layer of the silicon film. In such a photoelectric conversion member, since pixels absorbing the green wavelength exist over the entire surface of the photoelectric conversion member, there is theoretically no luminance moiré, and color moiré may be significantly suppressed.

However, in a case of performing green photoelectric conversion using the photoelectric conversion material described in '947 patent, when strong (e.g., relatively high intensity) light is received (e.g., is incident on the photoelectric conversion material) and then rapidly turned off (e.g., as a rapid drop in intensity of incident light), only the G pixels remain as an afterimage because the response of the organic material to the change in intensity of incident light is slower than that of the silicon.

For example, when the headlight of a vehicle is received in the immediate vicinity (e.g., light emitted from such a headlight within a certain proximity of the photoelectric conversion material is incident on the photoelectric conversion material), or when the sun is seen (e.g., incident on the photoelectric conversion material) on a sunny day in the summer, even if the strong (e.g., high-intensity) light such as the headlight or the sunlight is turned off within one frame of image data generated based on photoelectric conversion of the incident light by the photoelectric conversion material, the afterimage may occur in the next frame of the image data generated based on photoelectric conversion of the incident light by the photoelectric conversion material.

On the other hand, a dynamic range of an image has 256 gray levels for 8 bits. Therefore, when the strong light such as the headlight or the sunlight is expressed as a value of 256 or less, other subjects become relatively small values, resulting in a dark image. In general, there is no method of finely imaging a light source such as the headlight or the sunlight. Accordingly, such a light source is usually expressed as being saturated (e.g., a saturation region in a frame of image data). That is, the light source is expressed as a maximum value of 255 in the 8-bit grayscale and 1023 in the 10-bit grayscale in the frame of image data generated based on photoelectric conversion of incident light by the photoelectric conversion material.

Carriers are generated when the strong light is received. An amount of carriers that are remained until they disappear after the strong light is turned off can be theoretically calculated due to the characteristics of the photoelectric conversion member. Therefore, if the intensity of the strong light such as the headlight or the sunlight is known, the number of carriers contributing to the afterimage can be obtained. However, as described above, since the light source is expressed as saturated (e.g., a saturation region in a frame of image data generated based on photoelectric conversion of incident light by the photoelectric conversion material), it is difficult to actually measure the intensity of the strong light entering to (e.g., incident on) a sensor. Thus, the number (e.g., amount, quantity, etc.) of carriers contributing to the afterimage cannot be accurately calculated.

SUMMARY

Some example embodiments may provide moving image processing apparatuses and moving image processing methods that improve an image quality of a moving image by removing an afterimage that is generated after strong light is turned off.

According to some example embodiments, a moving image processing apparatus may include processing circuitry. The processing circuitry may be configured to extract position information of a saturation region from a first frame in which the saturation region is formed. The saturation region may include a limited plurality of pixels each having at least a threshold pixel value that is associated with an afterimage being formed in a subsequent frame elapsed from the first frame. The first frame may be among a plurality of frames forming a moving image, the plurality of frames including the first frame, a second frame elapsed from the first frame, and a third frame elapsed from the second frame. The processing circuitry may be configured to extract, as afterimage region data, image data of an afterimage region from the second frame, the afterimage region corresponding to the position information of the saturation region formed in the first frame. The processing circuitry may be configured to extract a first feature point of an image in the second frame and a second feature point of a separate image in the third frame. The processing circuitry may be configured to detect first motion information indicating motion between the second frame and the third frame based on performing matching between the first feature point and the second feature point. The processing circuitry may be configured to calculate second motion information of the afterimage region based on the first motion information. The processing circuitry may be configured to extract, as candidate region data, image data of a candidate region, in the third frame, that is matched to the afterimage region, the image data of the candidate region being extracted based on the second motion information. The processing circuitry may be configured to correct the afterimage region data in the second frame, based on the candidate region data.

The plurality of frames may be output from an image sensor including a plurality of pixels, the limited plurality of pixels being a limited portion of the plurality of pixels. The plurality of pixels may include a plurality of first pixels configured to photoelectrically convert a first light, a plurality of second pixels configured to photoelectrically convert a second light having a different wavelength from the first light, and a plurality of third pixels that is proximate to an incident light side of the image sensor, in relation to the plurality of first pixels and the plurality of second pixels, the plurality of third pixels configured to photoelectrically convert a third light having a different wavelength from the first light and the second light.

The processing circuitry may be configured to determine a ratio among a first pixel value representing luminance of the first light received by the first pixels in the candidate region data, a second pixel value representing luminance of the second light received by the second pixels in the candidate region data, and a third pixel value representing luminance of the third light received by the third pixels in the candidate region data. The processing circuitry may be configured to correct the third pixel value of the afterimage region data based on the ratio, a first pixel value representing luminance of the first light received by the first pixels in the afterimage region data, and a second pixel value representing luminance of the second light received by the second pixels in the afterimage region data.

The processing circuitry may be configured to, in response to a determination that a first pixel value representing luminance of the first light received by the first pixels in the candidate region data and a first pixel value representing luminance of the first light received by the first pixels the afterimage region data are greater than a second pixel value representing luminance of the second light received by the second pixels in the candidate region data and a second pixel value representing luminance of the second light received by the second pixels in the afterimage region data, correct the third pixel value in the afterimage region data based on a ratio, of the first pixel value representing luminance of the first light received by the first pixels in the candidate region data and a third pixel value representing luminance of the third light received by the third pixels in the candidate region data, and the first pixel value representing luminance of the first light received by the first pixels in the afterimage region data.

The processing circuitry may be configured to, in response to a determination that a first pixel value representing luminance of the first light received by the first pixels in the candidate region data and a first pixel value representing luminance of the first light received by the first pixels the afterimage region data is less than a second pixel value representing luminance of the second light received by the second pixels in the candidate region data and a second pixel value representing luminance of the second light received by the second pixels in the afterimage region data, correct the third pixel value in the afterimage region data, based on a ratio, of the second pixel value representing luminance of the second light received by the second pixels in the candidate region data and a third pixel value representing luminance of the third light received by the third pixels in the candidate region data, and the second pixel value representing luminance of the second light received by the second pixels in the afterimage region data.

The saturation region may include a limited plurality of adjacent first pixels, second pixels, and third pixels corresponding to separate, respective pixel values that are each at least a maximum value, among the plurality of first pixels, the plurality of second pixels, and the plurality of third pixels.

The first feature point may include a feature point within a threshold proximity of the afterimage region, and the processing circuitry may be configured to calculate the second motion information based on the first motion information corresponding to the feature point within the threshold proximity of the afterimage region.

The first feature point may include a plurality of feature points at least partially surrounding the afterimage region, the first motion information may include a plurality of first motion information corresponding to separate, respective feature points of the plurality of feature points, and the processing circuitry may be configured to calculate the second motion information based on the plurality of first motion information.

The processing circuitry may be configured to calculate the second motion information based on a weighted average of the plurality of first motion information, the weighted average calculated based on using a distance from a center of the afterimage region to each of the plurality of feature points as a weight.

The first light may include red light, the second light may include blue light, and the third light may include green light.

A photoelectric conversion member of the first pixels and second pixels may include silicon, and a photoelectric conversion member of the third pixels may include an organic semiconductor.

According to some example embodiments, a method of processing a moving image may include extracting position information of a saturation region from a first frame in which the saturation region is formed, the saturation region including a limited plurality of pixels each having at least a threshold pixel value that is associated with an afterimage being formed in a subsequent frame elapsed from the first frame, wherein the first frame is among a plurality of frames forming a moving image, the plurality of frames including the first frame, a second frame elapsed from the first frame, and a third frame elapsed from the second frame. The method may include extracting as afterimage region data, image data of an afterimage region from the second frame, the afterimage region corresponding to the position information of the saturation region formed in the first frame. The method may include extracting a first feature point of an image in the second frame and a second feature point of a separate image in the third frame. The method may include detecting first motion information indicating motion between the second frame and the third frame based on performing matching between the first feature point and the second feature point. The method may include calculating second motion information of the afterimage region based on the first motion information. The method may include extracting, as candidate region data, image data of a candidate region, in the third frame, that is matched to the afterimage region, the image data of the candidate region being extracted based on the second motion information.

The method may include correcting the afterimage region data in the second frame, based on the candidate region data.

The method may include outputting the plurality of frames from an image sensor including a plurality of pixels the limited plurality of pixels being a limited portion of the plurality of pixels. The plurality of pixels may include a plurality of first pixels configured to photoelectrically convert a first light; a plurality of second pixels configured to photoelectrically convert a second light having a different wavelength from the first light; and a plurality of third pixels that is proximate to an incident light side of the image sensor, in relation to the plurality of first pixels and the plurality of second pixels, the plurality of third pixels configured to photoelectrically convert a third light having a different wavelength from the first light and the second light.

Correcting the afterimage region data may include determining a ratio among a first pixel value representing luminance of the first light received by the first pixels in the candidate region data, a second pixel value representing luminance of the second light received by the second pixels in the candidate region data, and a third pixel value representing luminance of the third light received by the third pixels in the candidate region data. Correcting the afterimage region data may include correcting the third pixel value of the afterimage region data based on the ratio, a first pixel value representing luminance of the first light received by the first pixels in the afterimage region data, and a second pixel value representing luminance of the second light received by the second pixels in the afterimage region data.

The saturation region may include a limited plurality of adjacent first pixels, second pixels, and third pixels corresponding to separate, respective pixel values that are each at least a maximum value, among the plurality of first pixels, the plurality of second pixels, and the plurality of third pixels.

The first feature point may include a feature point within a threshold proximity of the afterimage region, and calculating second motion information may include calculating the second motion information based on the first motion information corresponding to the feature point within the threshold proximity of the afterimage region.

The first feature point may include a plurality of feature points at least partially surrounding the afterimage region. The first motion information may include a plurality of first motion information corresponding to separate, respective feature points of the plurality of feature points. Calculating second motion information may include calculating the second motion information based on the plurality of the first motion information.

The first light may include red light, the second light may include blue light, and the third light may include green light.

A photoelectric conversion member of the first pixels and second pixels may include silicon, and a photoelectric conversion member of the third pixels may include an organic semiconductor.

According to some example embodiments, a computer program may be stored on a non-transitory computer-readable medium, wherein the computer program is executable by a computing device to cause the computing device to: extract position information of a saturation region from a first frame in which the saturation region is formed, the saturation region including a limited plurality of pixels each having at least a threshold pixel value that is associated with an afterimage being formed in a subsequent frame elapsed from the first frame, wherein the first frame is among a plurality of frames forming a moving image, the plurality of frames including the first frame, a second frame elapsed from the first frame, and a third frame elapsed from the second frame; extract, as afterimage region data, image data of an afterimage region from the second frame, the afterimage region corresponding to the position information of the saturation region formed in the first frame; extract a first feature point of an image in the second frame and a second feature point of a separate image in the third frame; detect first motion information indicating motion between the second frame and the third frame based on performing matching between the first feature point and the second feature point; calculate second motion information of the afterimage region based on the first motion information; extract as candidate region data, image data of a candidate region, in the third frame, that is matched to the afterimage region, the image data of the candidate region being extracted based on the second motion information; and correct the afterimage region data in the second frame, based on the candidate region data.

DETAILED DESCRIPTION

Figure 1:
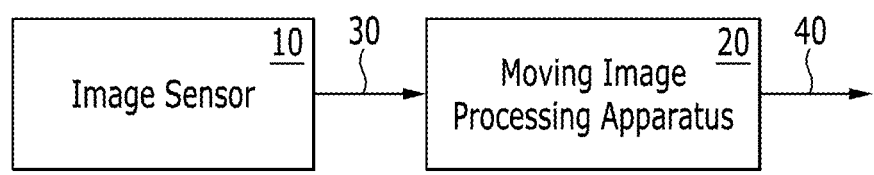
FIG. 1 is a diagram showing an imaging apparatus according to some example embodiments.

In the following detailed description, only some example embodiments of the present inventive concepts have been shown and described, simply by way of illustration. As those skilled in the art would realize, the described example embodiments may be modified in various different ways, all without departing from the spirit or scope of the present inventive concepts. Accordingly, the drawings and description are to be regarded as illustrative in nature and not restrictive. Like reference numerals designate like elements throughout the specification.

Hereinafter, a moving image processing apparatus according to some example embodiments is described. First, an image sensor and a moving image processing apparatus are described as an element of an imaging apparatus in which the moving image processing apparatus is embedded. Then, a moving image processing method is described as an operation of the moving image processing apparatus.

Configuration of Imaging Apparatus

FIG. 1 is a diagram showing an imaging apparatus according to some example embodiments. Referring to FIG. 1, an imaging apparatus 1 includes an image sensor 10 and a moving image processing apparatus 20. The imaging apparatus 1 may include other elements in addition to these elements. The imaging apparatus 1 processes a plurality of frames 30 imaged by the image sensor 10 (e.g., generated by the image sensor 10 based on photoelectric conversion of at least some light that is incident on the image sensor 10) in the moving image processing apparatus 20 and outputs them (e.g., the frames) as a moving image 40.

First, the image sensor 10 is described with reference to FIG. 2 and FIGS. 3A-3B.

Image Sensor

Figure 2:
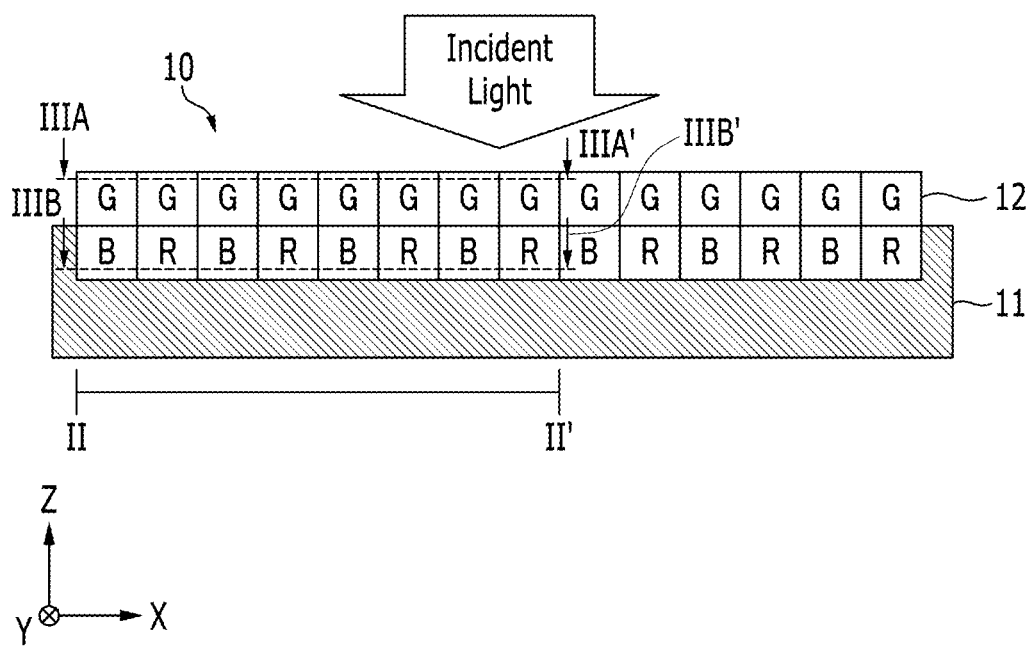
FIG. 2 shows a cross section of an image sensor in an imaging apparatus according to some example embodiments.
Figure 3A:
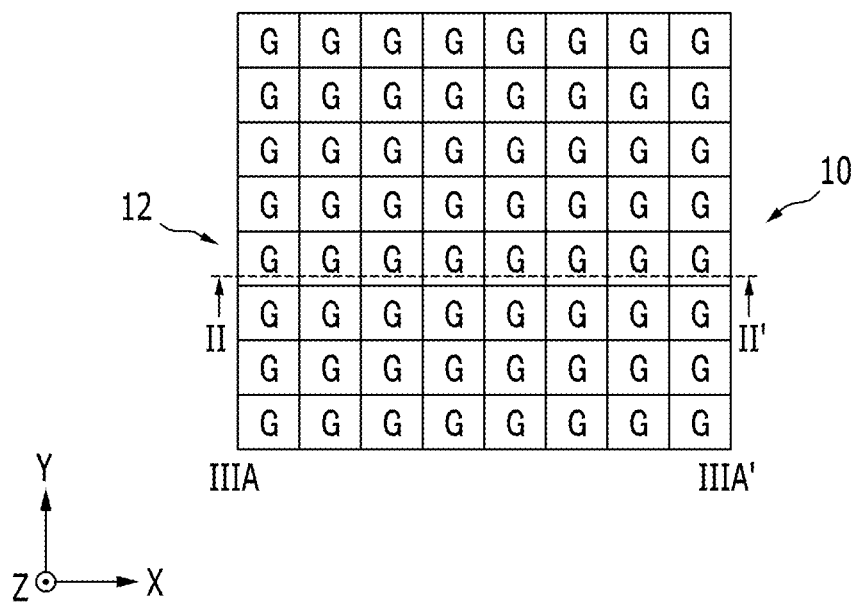
FIGS. 3A-3B are drawings of an image sensor in an imaging apparatus according to some example embodiments as viewed from a side in which an incident light enters.
Figure 3B:
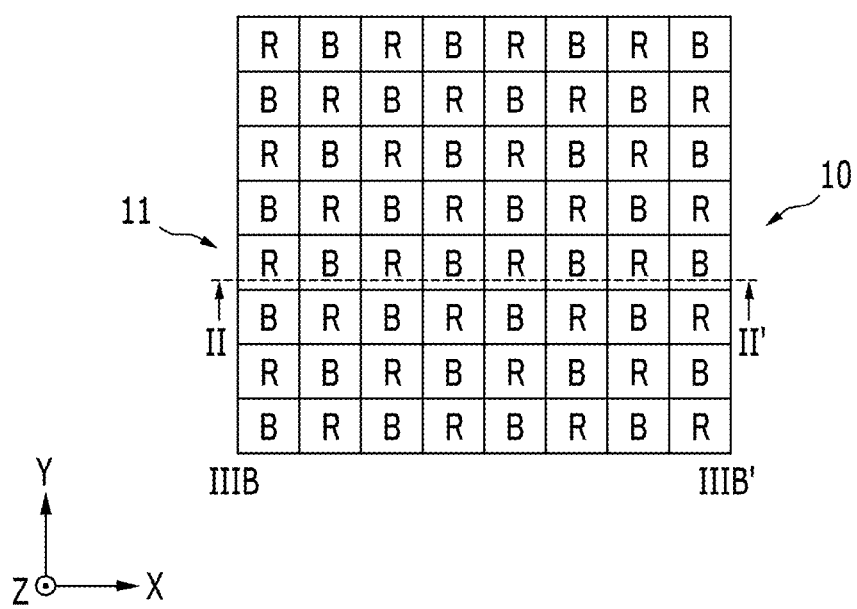

FIG. 2 shows a cross section of an image sensor in an imaging apparatus 1 according to some example embodiments. FIGS. 3A-3B are drawings of an image sensor in an imaging apparatus according to some example embodiments as viewed from a side in which an incident light enters. FIG. 2 is a cross section view of the image sensor shown in FIGS. 3A-3B along cross-section view lines II-II' shown in FIGS. 3A-3B. FIG. 3A is a cross section view of the image sensor shown in FIG. 2 along cross-section view line IIIA-IIIA' shown in FIG. 2. FIG. 3B is a cross section view of the image sensor shown in FIG. 2 along cross-section view line IIIB-IIIB' shown in FIG. 2. As shown in FIG. 2 and FIGS. 3A-3B, an image sensor 10 includes a plurality of R pixels configured to photoelectrically convert red light, a plurality of B pixels configured to photoelectrically convert blue light, and a plurality of G pixels configured to photoelectrically convert green light.

The lights (e.g., incident light) photoelectrically converted by the respective pixels of the image sensor 10 have different wavelengths, and are not limited to the red light, the blue light, and the green light. In some example embodiments, the image sensor 10 may include a plurality of first pixels configured to photoelectrically convert first light, a plurality of second pixels configured to photoelectrically convert second light having a different wavelength from the first light, and a plurality of third pixels configured to photoelectrically convert third light having a different wavelength from the first light and the second light. In FIG. 2 and FIGS. 3A-3B, the first light may the red light, the second light may be the blue light, and the third light may be the green light. Further, the first pixels may be the R pixels, the second pixels may be the B pixels, and the third pixels may be the G pixels. The respective lights may have different center wavelengths with respect to each other and have a certain wavelength range.

The image sensor 10 may include, for example, a substrate 11 and an organic photoelectric film 12. Although the image sensor 10 may further include electrodes and wiring, they are omitted in the drawings. The organic photoelectric film 12 is formed on the substrate 11. The substrate 11 may be, for example, a silicon substrate and include silicon as a photoelectric conversion member. The organic photoelectric film 12 may include, for example, an organic semiconductor as a photoelectric conversion member. The incident light enters from a side of the organic photoelectric film 12.

The plurality of R pixels (e.g., first pixels) and the plurality of B pixels (e.g., second pixels) are formed on the substrate 11. The plurality of G pixels are formed in the organic photoelectric film 12 and may be proximate to an incident light side of the image sensor 10, in relation to the plurality of R pixels and the plurality of B pixels. Therefore, the photoelectric conversion member of the R pixels and B pixels includes the silicon, and the photoelectric conversion member of the G pixels includes the organic semiconductor. The plurality of G pixels are provided on a side in which the incident light (i.e., the red light, the blue light, and the green light) enters compared with the plurality of R pixels and the plurality of B pixels.

In some example embodiments, the plurality of R pixels and the plurality of B pixels may be arranged in a matrix form in parallel to an upper surface of the substrate 11, and the plurality of G pixels may be also arranged in a matrix form in parallel to the upper surface of the substrate 11. For example, if two directions orthogonal to each other in a plane parallel to the upper surface of the substrate 11 are an X-axis direction and a Y-axis direction, each pixel is arranged at a position indicated by (x, y) coordinates. Here, for example, 'x' denotes one of the first to P-th pixel columns linearly arranged in the Y-axis direction, and 'y' denotes one of the first to Q-th pixel lines linearly arranged in the X-axis direction.

In some example embodiments, the plurality of R pixels and the plurality of B pixels may be arranged, for example, in a checkered pattern on the upper surface of the substrate 11 when viewed in a Z-axis direction. The plurality of G pixels may be arranged, for example, in the matrix form on the organic photoelectric film 12 when viewed in the Z-axis direction. In addition, the arrangement of the plurality of R pixels and the plurality of B pixels and the arrangement of the plurality of G pixels are not limited to the checkered pattern and the matrix form, respectively, and may be, for example, a honeycomb pattern.

A signal photoelectrically converted in each pixel, based on light of one or more particular wavelengths being incident on said pixel, is output to at least partially form (e.g., generate) the plurality of frames 30 forming (e.g., comprising) the moving image 40 through a driving circuit (not shown) formed on the substrate 11. Signals photoelectrically converted at different times may comprise different frames of the plurality of frames 30. The plurality of frames 30 may include separate frames that correspond to separate points or periods in time at which photoelectric conversion of incident light at the image sensor 10 is performed. The plurality of frames 30 generated (e.g., output) by the image sensor 10 may be referred to herein as image data generated by the image sensor 10 based on photoelectric conversion of at least some light that is incident on the image sensor 10.

A signal generated by a given pixel of the image sensor 10 may indicate a pixel value associated with the pixel of the image sensor, where the pixel value may indicated a brightness of light incident on, and photoelectrically converted by the given pixel. Different pixel values corresponding to different pixels of the image sensor 10 may collectively define a frame and/or image, where the brightness and/or color of each pixel of the frame and/or image may correspond to a pixel value of a corresponding pixel of the image sensor 10.

Figure 4:
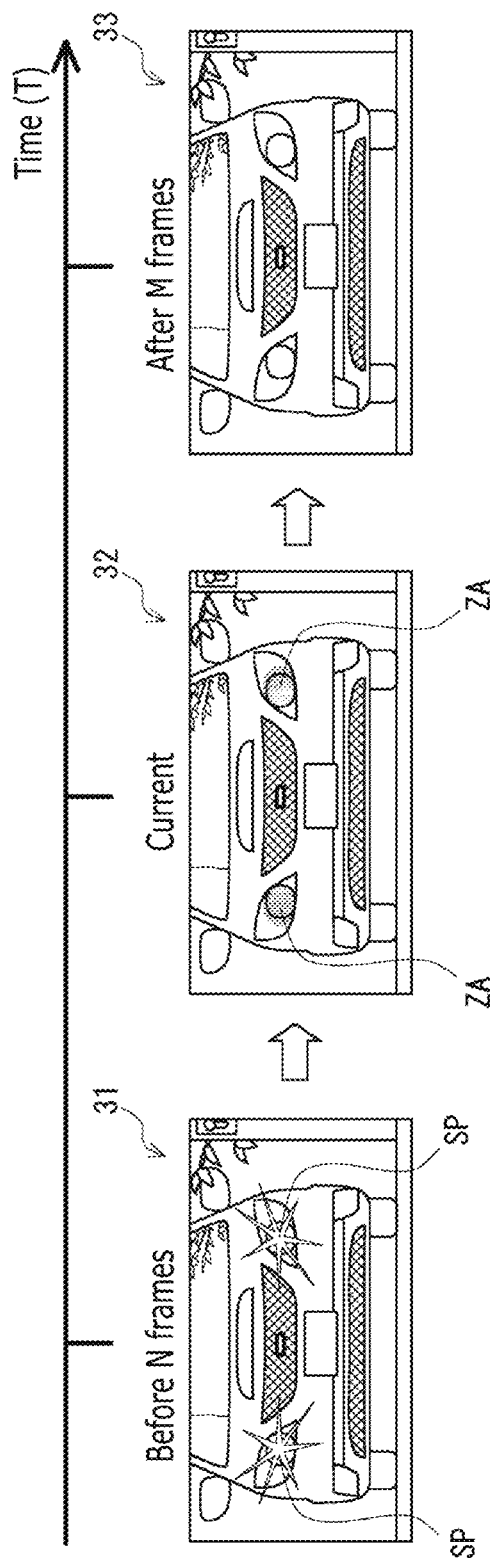
FIG. 4 is a diagram showing a plurality of frames output by an image sensor in an imaging apparatus according to some example embodiments.

FIG. 4 is a diagram showing a plurality of frames of image data output (e.g., generated) by an image sensor 10 in an imaging apparatus according to some example embodiments. Referring to FIG. 4, a plurality of frames 30 may include, for example, a first frame 31, a second frame 32, and a third frame 33. The second frame 32 is a frame 30 which has elapsed from the first frame 31 (e.g., is generated based on signals generated by the image sensor 10 subsequent to signals generated by the image sensor 10 upon which the first frame 31 is based), and the third frame 33 is a frame 30 which has elapsed from the second frame 32 (e.g., is generated based on signals generated by the image sensor 10 subsequent to signals generated by the image sensor 10 upon which the second frame 32 is based).

The first frame 31, the second frame 32, and the third frame 33 may be consecutive when they are arranged in time order, and one or more frames 30 may be inserted between the respective frames 30. Accordingly, assuming that the first frame 31 is a frame 30 before N frames than the second frame 32, and the third frame 33 is a frame 30 after M frames than the second frame 32, N may be equal to one, or may be greater than or equal to two. Further, M may be equal to one, or may be greater than or equal to two. The plurality of frames 30 including the first frame 31, the second frame 32, and the third frame 33 form a moving image 40.

Based on a time when the second frame 32 is output from the image sensor 10, the second frame 32 may be called a current frame 30 or a current image, the first frame 31 may be called (e.g., referred to as) a past frame 30 or a past image, and the third frame 33 may be called a future frame 30 or a future image.

For example, as shown in FIG. 4, a vehicle and a background of the vehicle are imaged as an object on the first frame 31, the second frame 32, and the third frame 33. Actually, the first frame 31, the second frame 32, and the third frame 33 may be imaged in color.

In the first frame (the past image) 31, strong light called spot light SP is received at the image sensor 10. Specifically, a headlight of the vehicle is turned on, and a plurality of pixels of the image sensor 10 that have imaged the headlight receive the spot light SP.

In the second frame (the current image) 32, only pixel values of G pixels receiving green light do not decrease under the influence of the spot light SP (e.g., the photoelectric conversion device that includes film 12 continues to output a signal corresponding to the incident spot light SP for at least a period of time after the spot light SP is no longer incident on the image sensor 10), resulting in a green afterimage ZA in at least frame 32. In FIG. 4, although the afterimage ZA of the headlight portion is shown in a gray color, it may be a green afterimage ZA in an actual color image.

In the third frame (future image) 33, the effect of spot light SP disappears and the afterimage ZA extinguishes, (e.g., based on the photoelectric conversion device that includes film 12 no longer outputting a signal corresponding to the incident spot light SP, after at least a certain period of time after the spot light SP is no longer incident on the image sensor 10 has elapsed). The moving image processing apparatus 20 according to some example embodiments processes and outputs the plurality of frames 30 forming the moving image 40 output from the image sensor 10. One process among processes performed by the moving image processing apparatus 20 is to (e.g., the moving image processing apparatus 20 may be configured to) remove the green afterimage ZA generated after the strong light such as the spot light SP is turned off from one or more frames (e.g., frame 32) of the moving image 40.

Moving Image Processing Apparatus

Each element of the moving image processing apparatus 20 may be implemented, for example, by executing a program (e.g., a program of instructions, which may be stored in a memory) under a control of processing circuitry (not shown) provided in a computing device. For example, in some example embodiments, the moving image processing apparatus 20 may be included in and/or implemented using processing circuitry such as hardware including logic circuits, a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC). In some example embodiments, the processing circuitry may include a non-transitory computer readable storage device (e.g., a memory), for example a solid state drive (SSD), or the like, storing a program of instructions, and a processor (e.g., a CPU) configured to execute the program of instructions to implement the functionality of and/or methods performed by some or all of the moving image processing apparatus 20 and/or any portions thereof (e.g., any or all of units 21-27 shown in FIG. 5).

Each element of the moving image processing apparatus 20 is described below. It will be understood that each element may be implemented by processing circuitry included in and/or implementing the moving image processing apparatus 20, such that the functionality of any of the elements of the moving image processing apparatus 20 as shown in FIG. 5 may be understood to be functionality implemented by processing circuitry included in and/or implementing the moving image processing apparatus 20, for example based on the processing circuitry including a memory storing a program of instructions and a processor that is configured to execute the program of instructions to implement some or all of said functionality.

Figure 5:
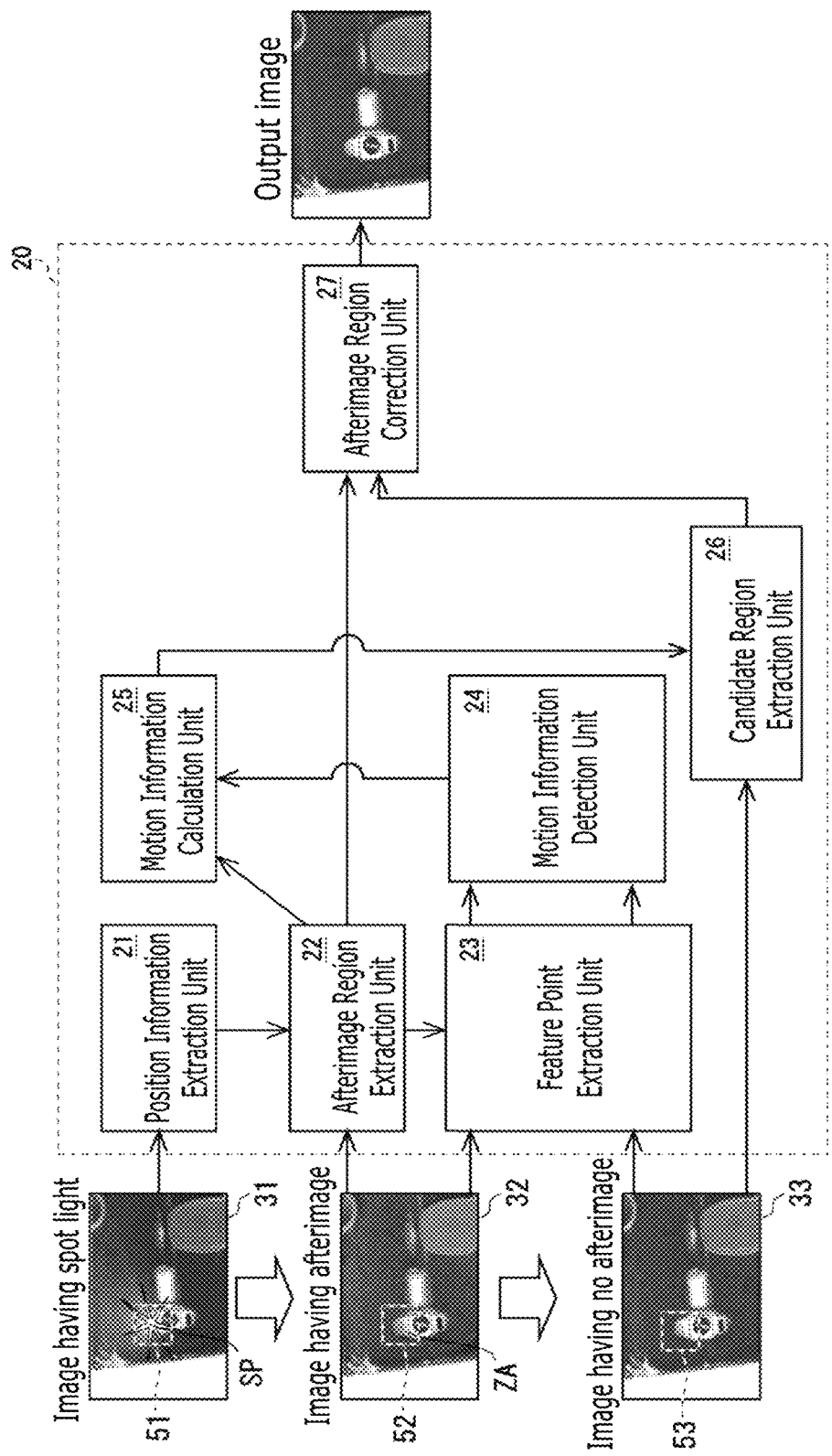
FIG. 5 is a diagram showing a configuration of a moving image processing apparatus in an imaging apparatus according to some example embodiments.

FIG. 5 is a diagram showing a configuration of a moving image processing apparatus 20 in an imaging apparatus 1 according to some example embodiments. Referring to FIG. 5, in some example embodiments, a moving image processing apparatus 20 may include (e.g., may include processing circuitry configured to implement) a position information extraction unit 21, an afterimage region extraction unit 22, a feature point extraction unit 23, a motion information detection unit 24, a motion information calculation unit 25, a candidate region extraction unit 26, and an afterimage region correction unit 27. In some example embodiments, the moving image processing apparatus 20 may include a processing circuitry. The processing circuitry may execute a program thereby realizing all processes (e.g., all units 21-27) in the moving image processing apparatus 20. That is, the processing circuitry may function as the position information extraction unit 21, the afterimage region extraction unit 22, the feature point extraction unit 23, the motion information detection unit 24, the motion information calculation unit 25, the candidate region extraction unit 26, and the afterimage region correction unit 27 according to some example embodiments by executing the program. The moving image processing apparatus 20 may process and output a plurality of frames 30 forming a moving image 40 input from an image sensor 10 through the units 21 to 27.

FIG. 5 shows another example of a first frame 31, a second frame 32, and a third frame 33 forming a moving image 40. In each of the frames 31 to 33, a portion including an LED light (e.g., LED light emitter) of a mobile device is imaged.

Position Information Extraction Unit

Referring to FIG. 5, a position information extraction unit 21 extracts position information (e.g., pixel coordinates) of a saturation region 51 from a first frame 31. The saturation region 51 is a region of an image/frame including a plurality of pixels that receive spot light SP causing an afterimage ZA, such pixels may be determined to have a pixel value (e.g., output respective signals corresponding to separate, respective pixel values) that have at least a threshold (e.g., maximum) pixel value that may be determined to be associated with an afterimage being formed in at least one subsequent frame elapsed from the first frame 31). In some example embodiments, the saturation region 51 may be a region that is predicted to generate the afterimage ZA based on receiving the spot light SP, e.g., based on the pixel values of the pixels in said region.

In some example embodiments, the saturation region 51 may be a portion of the first frame including the LED light part (e.g., including an image of the LED light emitter of the mobile device) in the first frame 31 shown in FIG. 5. When R pixels, B pixels, and G pixels having at least threshold (e.g., maximum) pixel values are concentrated (e.g., are adjacent to each other in a frame or image), the saturation region 51 may be a region including a plurality of neighboring (e.g., adjacent) G pixels, B pixels, and G pixels representing (e.g., photoelectrically converting incident light to generate output signals corresponding to) the threshold (e.g., maximum) pixel values. As described herein, a maximum pixel value may be a threshold pixel value associated with an afterimage being formed in a subsequent frame elapsed from the frame in which the pixels having the threshold pixel value are located. Hereinafter, an example in which the saturation region 51 is not extracted (FIG. 6 and FIG. 7) and an example in which the saturation region 51 is extracted (FIG. 8 and FIG. 9) are described with reference to the drawings.

Figure 6:
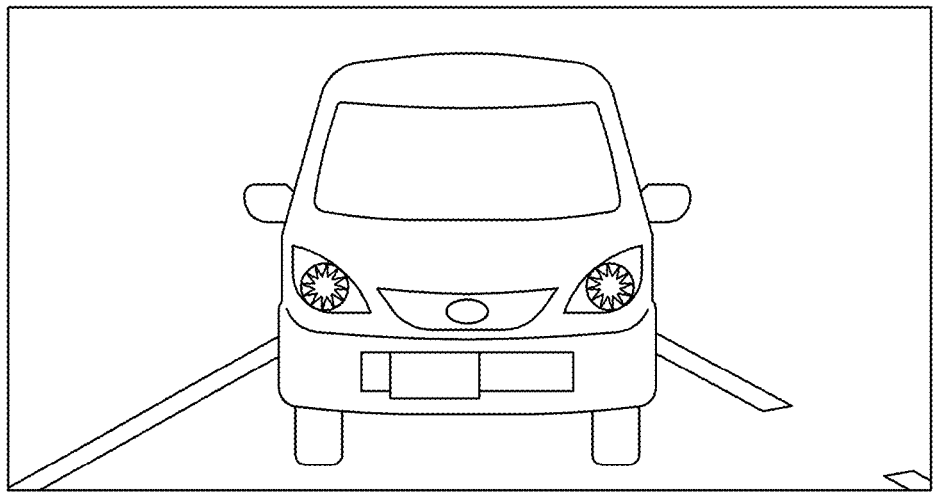
FIG. 6 is a diagram showing a region which a position information extraction unit does not extract as a saturation region 51 in a moving image processing apparatus 20 according to some example embodiments.
Figure 7:
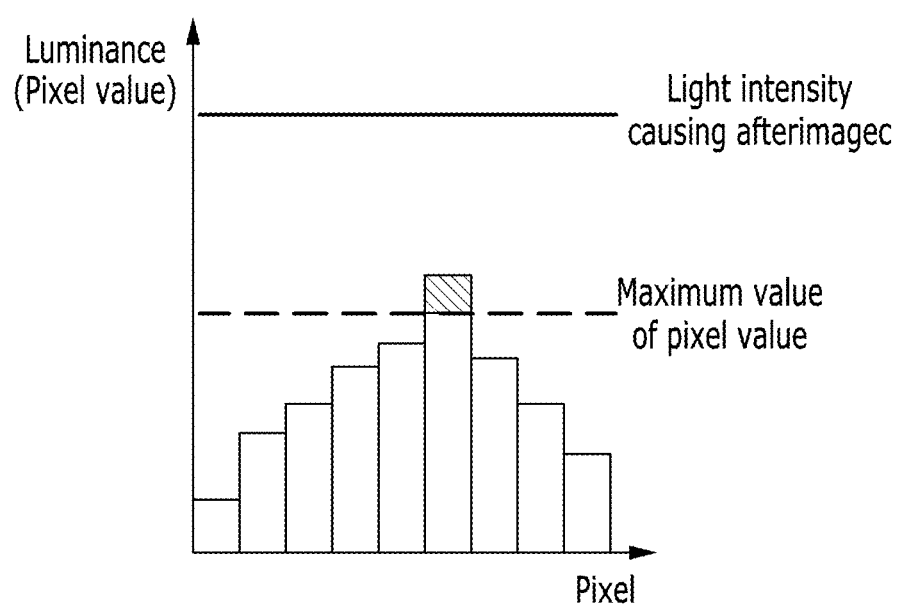
FIG. 7 is a graph showing a pixel value of each pixel in a region which a position information extraction unit does not extract as a saturation region in a moving image processing apparatus according to some example embodiments, where a horizontal axis represents a pixel location and a vertical axis represents a pixel value.

FIG. 6 is a diagram showing a region which a position information extraction unit 21 does not extract a saturation region 51 in a moving image processing apparatus 20 according to some example embodiments. FIG. 7 is a graph showing a pixel value of each pixel in a region which a position information extraction unit 21 does not extract as a saturation region 51 in a moving image processing apparatus 20 according to some example embodiments. In FIG. 7, a horizontal axis represents a pixel location and a vertical axis represents a pixel value. In FIG. 7, the pixel value is expressed in correlation with luminance. Each "pixel value" as described herein may correspond to (e.g., may indicate and or may be based on) a magnitude of an output signal generated by a corresponding pixel (e.g., photodiode, portion of a photoelectric conversion device located within and/or defining a pixel, etc. in response to incident light).

As shown in FIG. 6, a vehicle turns on a headlight. In this case, however, the headlight is not as strong as spot light SP that causes an afterimage. Therefore, an image sensor 10 does not receive the spot light SP that causes the afterimage ZA.

As shown in FIG. 7, in a case where only one pixel in a particular (or, alternatively, predetermined) region of a frame or image generated based on output signals generated by the image sensor 10 in response to photoelectric conversion of incident light by the pixels of the image sensor 10 has a maximum value, it is less likely that the spot light SP has an intensity which causes the afterimage ZA. That is, when the pixel having the maximum value is an isolated pixel, it is unlikely that the light intensity will cause the afterimage ZA. Therefore, in this case, the position information extraction unit 21 may not extract the saturation region 51. A pixel that receives light having a luminance greater than the luminance corresponding to the maximum value of the pixel value is saturated and responsively outputs a signal that is expressed as the maximum value.

The pixel value represents the luminance of the light received by the pixel and corresponds to a signal output by the pixel in response to photoelectric conversion of said received (e.g., incident light) by the pixel. The greater the luminance is, the greater the pixel value is (e.g., the magnitude of the pixel value relating to an output signal generated by a pixel is proportional to, and/or corresponds to, the luminance of the incident light that is incident on the pixel). When the dynamic range representing the luminance is expressed in 8 bits, it becomes 256 grayscales of 0~255. In this case, a maximum value (e.g., threshold pixel value) is 255. When the dynamic range representing the luminance is expressed in 10 bits, it becomes 1024 grayscales of 0~1023. In this case, a maximum value (e.g., threshold pixel value) is 1023.

When strong light such as headlight of a vehicle or sunlight on a sunny day in the summer is expressed within 256 or 1024 grayscales, a normal subject that can be recognized by the naked eye has a grayscale close to black and becomes indistinguishable. In general imaging, it is difficult to aim to accurately image a light source such as the headlight of the vehicle or the sunlight on the sunny day in the summer so that the strong light is saturated and expressed as the maximum value.

Figure 8:
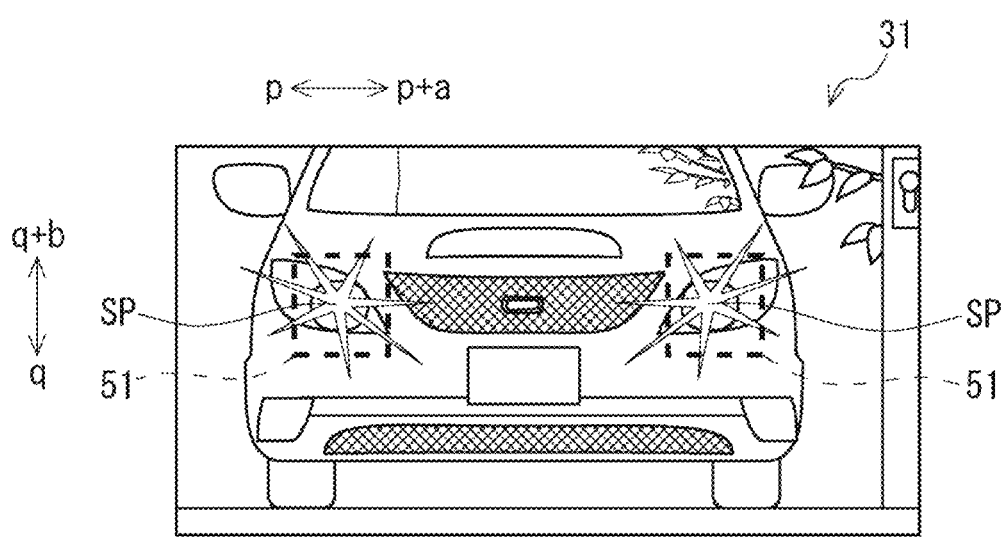
FIG. 8 is a diagram showing a region that a position information extraction unit extracts as a saturation region in a moving image processing apparatus according to some example embodiments.
Figure 9:
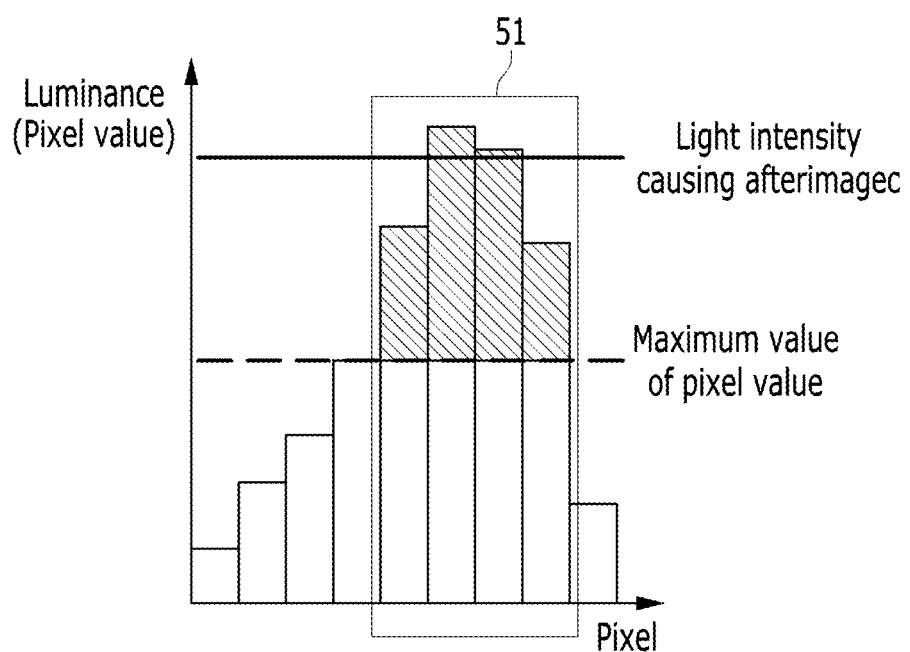
FIG. 9 is a graph showing a pixel value of each pixel in a region that a position information extraction unit extracts as a saturation region in a moving image processing apparatus according to some example embodiments, where a horizontal axis represents a pixel location and a vertical axis represents a pixel value.

FIG. 8 is a diagram showing a region that a position information extraction unit 21 extracts as a saturation region 51 in a moving image processing apparatus 20 according to some example embodiments. FIG. 9 is a graph showing a pixel value of each pixel in a region that a position information extraction unit 21 extracts as a saturation region 51 in a moving image processing apparatus 20 according to some example embodiments. In FIG. 9, a horizontal axis represents a pixel location of a pixel, and a vertical axis represents a pixel value of the pixel.

As shown in FIG. 8, a headlight that is turned on by a vehicle emits strong light. In this case, an image sensor 10 receives spot light SP that causes an afterimage ZA. Accordingly, a saturation region 51 including a plurality of pixels that receive the spot light SP is formed in an image (e.g., frame 31) based at least in part upon the spot light SP being incident on the image sensor 10, where such pixels may be a limited plurality of pixels (e.g., a limited portion of the pixels of the image sensor and/or frame) each having at least a threshold (e.g., maximum) pixel value that is associated with an afterimage being formed in a subsequent frame elapsed from the first frame 31).

As shown in FIG. 9, when pixels representing threshold (e.g., maximum) values are clustered (e.g., adjacent) in a particular (or, alternatively, predetermined) region in a frame or image (e.g., in response to a determination of such clustering), a position information extraction unit 21 extracts the pixels as a saturation region 51. When receiving extremely strong light such as the spot light SP, the intensity may be gently changed due to scattering. Therefore, the pixels having the maximum values in the gentle gradient of the intensity may become continuous. Accordingly, in the saturation region 51, the R pixels, the B pixels, and the G pixels having the maximum values are concentrated. That is, in the saturation region 51 including the pixels that receives the spot light SP, the R pixels, the B pixels, and the G pixels representing maximum pixel values are concentrated, and a particular (or, alternatively, predetermined) number (e.g., quantity) or more of the pixels representing the maximum values exist. In some example embodiments, the saturation region 51 may include a plurality of neighboring R pixels, B pixels, and G pixels representing the maximum values (e.g., having generated output signals corresponding to pixel values that have a magnitude that is at least the magnitude of the maximum value).

The position information extraction unit 21 extracts position information (e.g., pixel coordinates) on the frame of the saturation region 51 from the first frame 31 in which the saturation region 51 is formed among the plurality of frames 30 forming the moving image 40. For example, as shown in FIG. 8, the position information extraction unit 21 may extract as the saturation region 51 a region including pixels in a range from p to (p+a) in the x axis and a range from q to (q+b) in the y axis on the first frame 31. Here, p and (p+a) denote pixel column numbers (e.g., coordinates) in the x-axis direction, and q and (q+b) denote pixel line numbers (e.g., coordinates) in the y-axis direction.

Afterimage Region Extraction Unit

Figure 10:
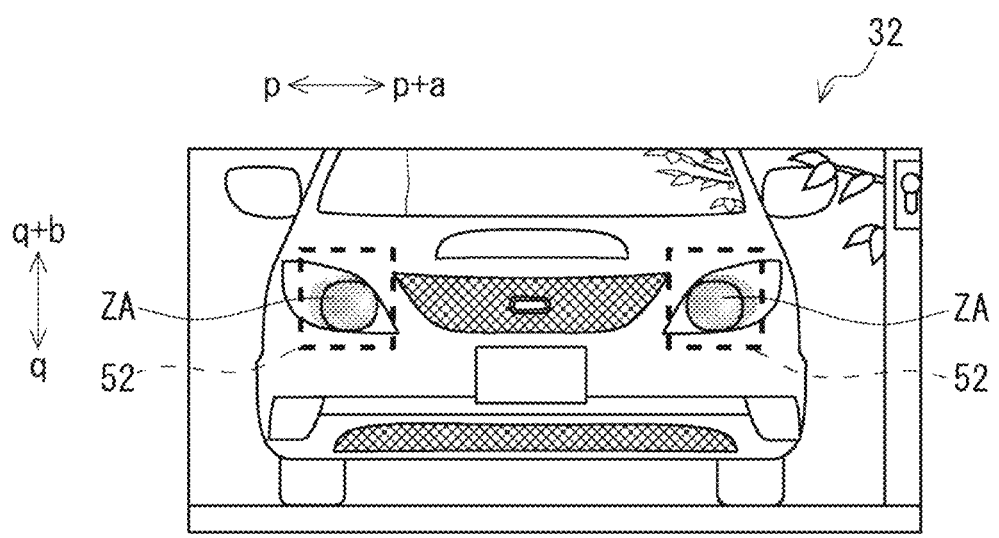
FIG. 10 is a diagram showing a region which an afterimage region extraction unit extracts as an afterimage region in a moving image processing apparatus according to some example embodiments.

FIG. 10 is a diagram showing a region which an afterimage region extraction unit 22 extracts as an afterimage region 52 in a moving image processing apparatus 20 according to some example embodiments. Referring to FIG. 5 and FIG. 10, an afterimage region extraction unit 22 extracts as afterimage region data image data of an afterimage region 52 corresponding to position information of a saturation region 51 from a second frame 32.

In some example embodiments, the afterimage region extraction unit 22 may extract as the afterimage region 52 a region including pixels in a range from p to (p+a) in the x axis and a range from q to (q+b) in the y axis on the second frame 32. The afterimage region 52 includes a plurality of pixels where the afterimage ZA has been generated by receiving the spot light SP. The afterimage region extraction unit 22 extracts the image data of the afterimage region 52 as afterimage region data. In some example embodiments, the afterimage region extraction unit 22 may cut the afterimage region data into, for example, a rectangular shape in the second frame 32.

Feature Point Extraction Unit

Figure 11:
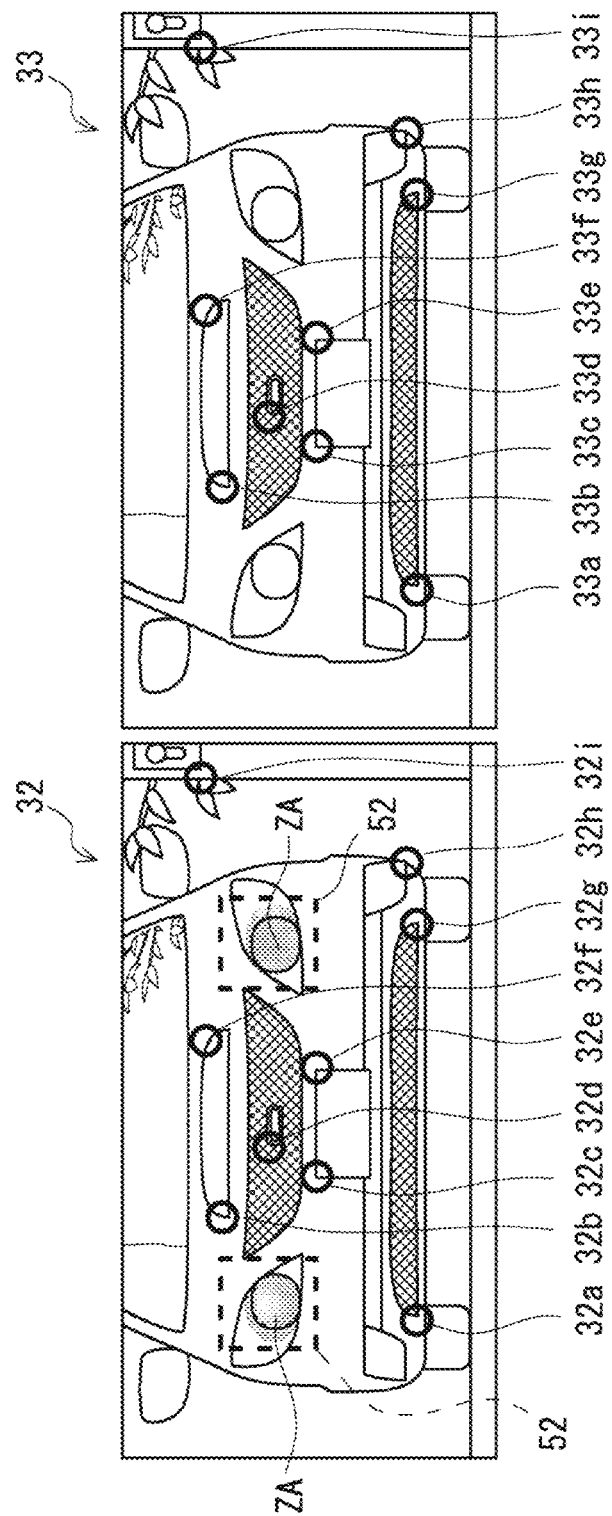
FIG. 11 is a diagram showing a feature points extracted by a feature point extraction unit on a second frame and a third frame in a moving image processing apparatus according to some example embodiments.

FIG. 11 is a diagram showing feature points extracted by a feature point extraction unit 23 on a second frame 32 and a third frame 33 in a moving image processing apparatus 20 according to some example embodiments. Referring to FIG. 11, a feature point extraction unit 23 extracts a plurality of feature points 32a, 32b, 32c, 32d, 32e, 32f, 32g, 32h, and 32i of an image in a second frame 32 and a plurality of feature points 33a, 33b, 33c, 33d, 33e, 33f, 33g, 33h, and 33i of an image in a third frame 33.

In some example embodiments, the feature point extraction unit 23 may extract a portion having a large change, such as an edge or a peak, of an imaged object in the second frame 32 as the feature points 32a to 32i.

In some example embodiments, the feature point extraction unit 23 may extract a portion having a large change, such as an edge or a peak, of an imaged object in the third frame 33 as the feature points 33a to 33i.

For example, orientation fast and rotated brief (ORB), speed up robust features (SURF), or scale invariant feature transform (SIFT) may be used as a method of extracting the feature points.

Motion Information Detection Unit

Figure 12:
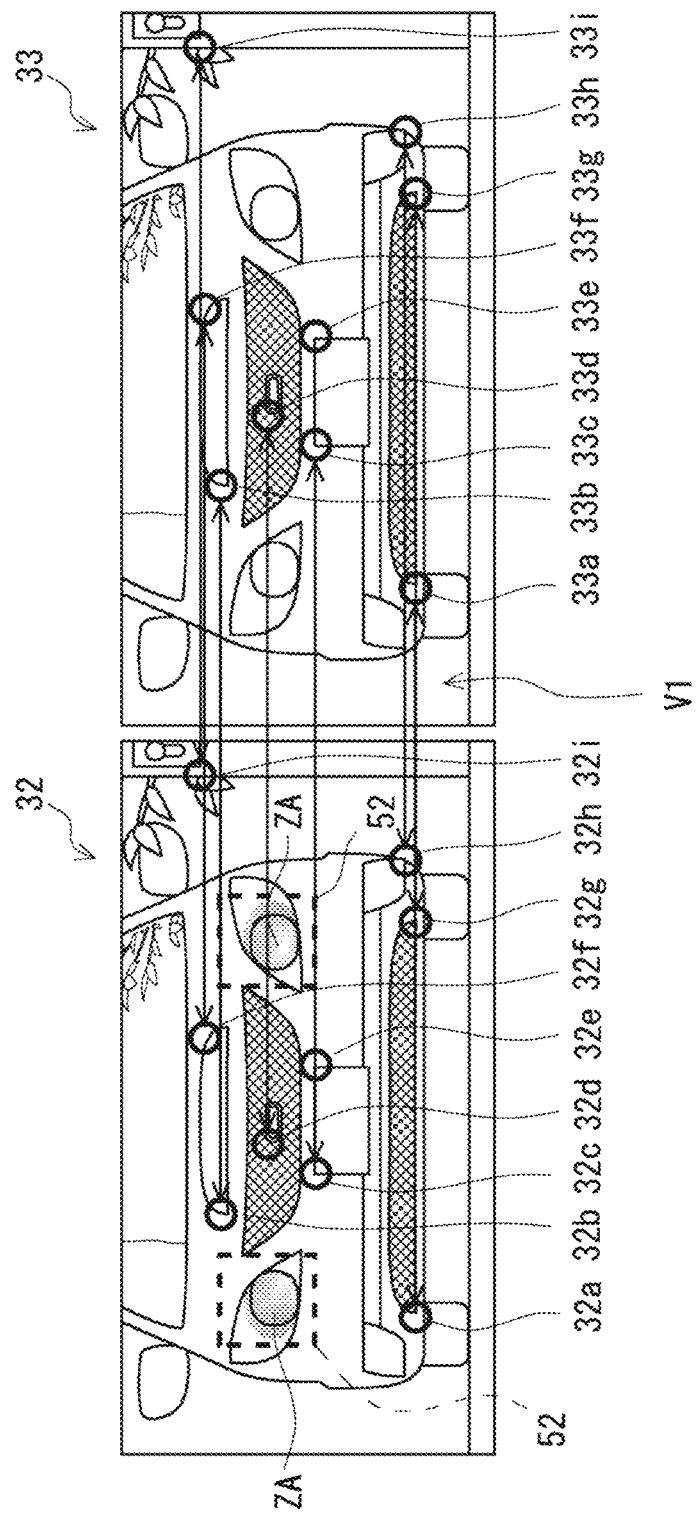
FIG. 12 is a diagram showing motion information detected by a motion information detection unit in a moving image processing apparatus according to some example embodiments.

FIG. 12 is a diagram showing motion information detected by a motion information detection unit 24 in a moving image processing apparatus 20 according to some example embodiments. Referring to FIG. 12, a motion information detection unit 24 detects motion information V1 between a second frame 32 and a third frame 33 by performing matching between feature points 32a to 32i in the second frame 32 and feature points 33a to 33i in the third frame 33. In some example embodiments, the motion information V1 may be a motion vector. The motion information V1 is detected between each of the feature points 32a to 32i and each of the feature points 33a to 33i, but this is collectively referred to as motion information V1. Accordingly, the motion information V1 may include a plurality of motion information V1 corresponding to separate, respective feature points of the feature points 32a to 32i and/or the feature points 33a to 33i and/or pairs thereof.

In some example embodiments, the motion information detection unit 24 may first perform feature classification on each of the feature points 32a to 32i and each of the feature points 33a to 33i. Then, the motion information detection unit 24 may perform matching between each of the feature points 32a to 32i in the second frame 32 and each of the feature points 33a to 33i in the third frame 33. In some example embodiments, the motion information detection unit 24 may determine how the object in frame 30 has moved (e.g., distance and/or direction movement of the object in the image, pixel coordinate change in the image, etc.). For example, the motion information detection unit 24 may construct a pair of feature points by performing matching on each of the feature points 32a to 32i and each of the feature points 33a to 33i between the second frame 32 and the third frame 33. In some example embodiments, how this pair has moved between the two frames 30 (e.g., magnitude and/or direction of movement, e.g., in terms of x, y pixel coordinate changes) may become the motion information V1.

Motion Information Calculation Unit

A motion information calculation unit 25 calculates motion information V2 of an afterimage region 52 based on detected motion information V1. The afterimage region 52 extracted by an afterimage region extraction unit 22 may be generally given in a rectangular shape as described above. For example, the motion information V2 representing the rectangular afterimage region 52 may be equal to motion information V1 of feature points in the afterimage region 52. However, there may be cases where the motion information V2 is not immediately determined by matching between the feature points. For example, no feature point may exist in the rectangle, or even if a feature point exists in the rectangle, there may be a case where the matching with the third frame cannot be performed.

Therefore, in some example embodiments, when the motion information V2 is not immediately determined by the matching between the feature points, the motion information calculation unit 25 may calculate the motion vector V2 of the afterimage region 52, for example, according to the following two methods.

1. A method of using the motion vector V1 by matching between feature points in the vicinity (within a threshold proximity distance) of the afterimage region 52 within the second frame 32. In some example embodiments, the motion information calculation unit 25 may calculate the motion information V2 using the motion information V1 of the feature points in the vicinity (e.g., within a threshold proximity distance) of the afterimage region 52.

2. A method of calculating the motion vector V2 of the afterimage region 52 based on an arithmetic mean of the motion information V1 around the afterimage region 52. In some example embodiments, the motion information calculation unit 25 may calculate the motion information V2 of the afterimage region 52 by calculating the motion information V2 based on a plurality of motion information V1 of a plurality of feature points in the vicinity of the afterimage region 52. As the arithmetic mean, a method of using a weighted average depending on a distance from the center of the afterimage region 52 to each feature point may be used, where the motion information V2 may be calculated based on a weighted average of the motion information V1, the weighted average calculated based on using a distance from a center of the afterimage region 52 to each of the feature points (e.g., 33a to 33i) as a weight.

Figure 13:
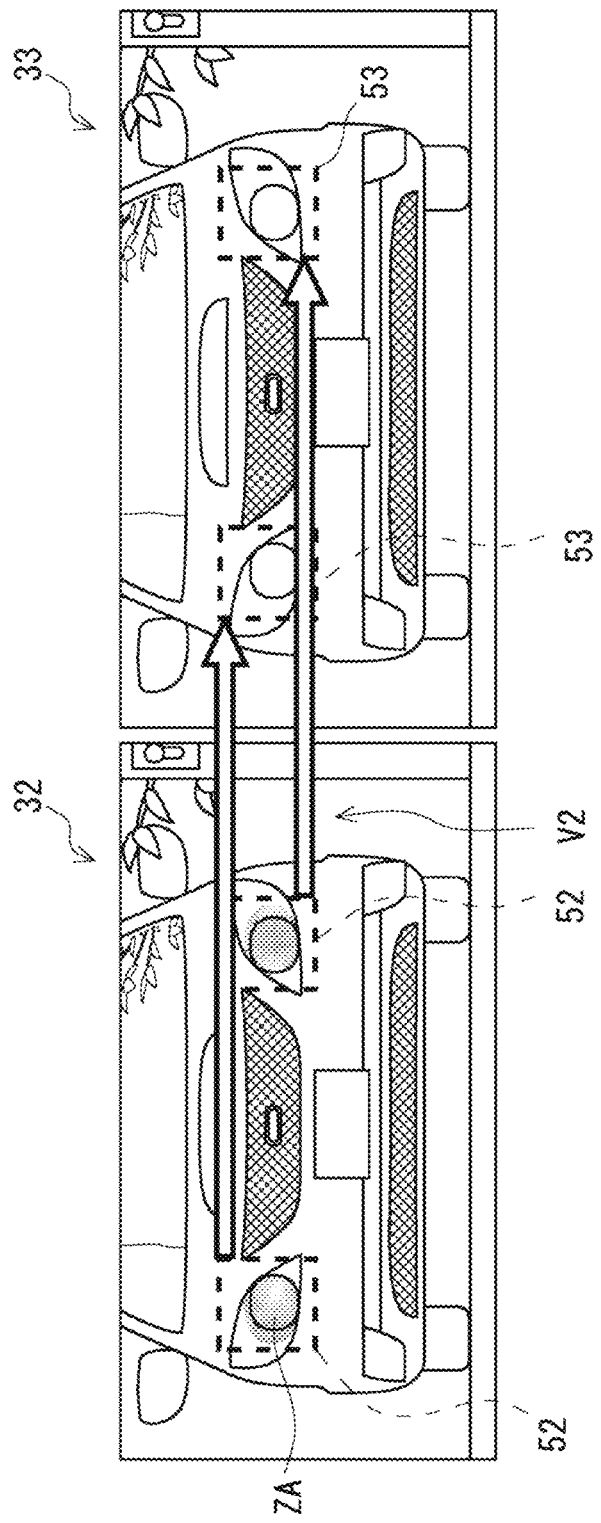
FIG. 13 is a diagram showing motion information calculated by a motion information calculation unit in a moving image processing apparatus according to some example embodiments.

FIG. 13 is a diagram showing motion information V2 calculated by a motion information calculation unit 25 in a moving image processing apparatus 20 according to some example embodiments. Referring to FIG. 13, a motion information calculation unit 25 calculates second motion information V2 of an afterimage region 52 according to the calculation method described above.

Candidate Region Extraction Unit

A candidate region extraction unit 26 extracts image data of a candidate region 53 matched with an afterimage region 52 in a third frame 33 as candidate region data based on the calculated motion information V2. In some example embodiments, the candidate region extraction unit 26 may extract, in the third frame 33, the candidate region 53 for compensating the afterimage region 52 from the motion vector V2 of the afterimage region 52 calculated by the motion information calculation unit 25. In addition, the candidate region extraction unit 26 may extract the image data of the candidate region 53 from the third frame 33.

Afterimage Region Correction Unit

An afterimage region correction unit 27 corrects afterimage region data based on candidate region data. In some example embodiments, the afterimage region correction unit 27 may, for example, correct a pixel value G2 representing luminance of green light received by a G pixel of the afterimage region data, based on a ratio among a pixel value R3 representing luminance of red light received by a R pixel, a pixel value B3 representing luminance of blue light received by a B pixel, and a pixel value G3 representing luminance of green light received by a G pixel in the candidate region data, for example, a ratio of the pixel value R3 and the pixel value G3 and a ratio of the pixel value B3 and the pixel value G3, and a ratio of a pixel value R2 representing luminance of red light received by a R pixel and a pixel value B2 representing luminance of blue light received by a B pixel in the afterimage region data. In this way, the afterimage region correction unit 27 may correct the pixel value G2 of the G pixel in a second frame 32, which causes the green afterimage. This processing is described with reference to the drawings.

Figure 14:
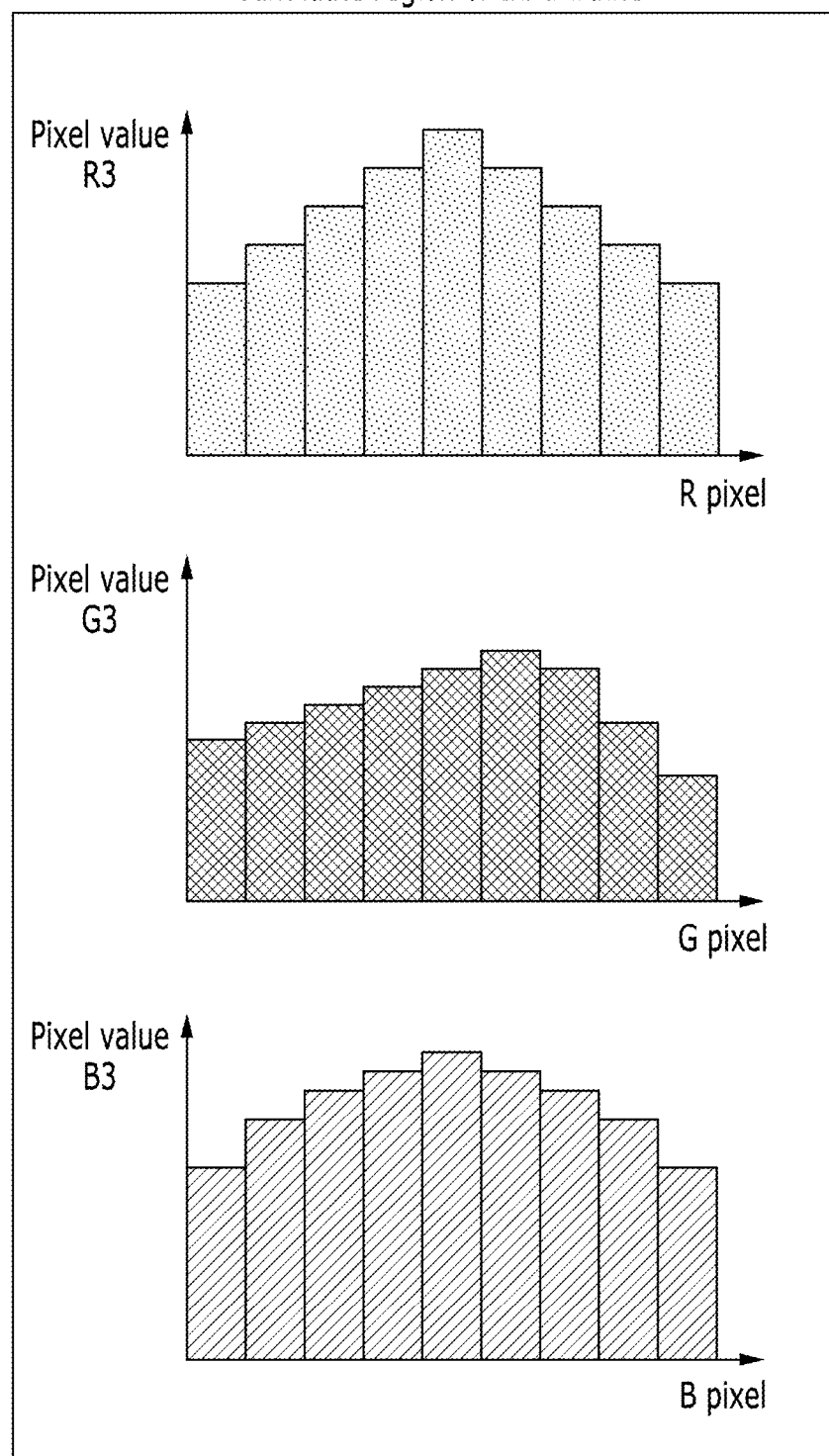
FIG. 14 is a graph showing each pixel value of a candidate region in a third frame in a moving image processing apparatus according to some example embodiments, where a horizontal axis represents a pixel position and a vertical axis represents a pixel value.
Figure 15:
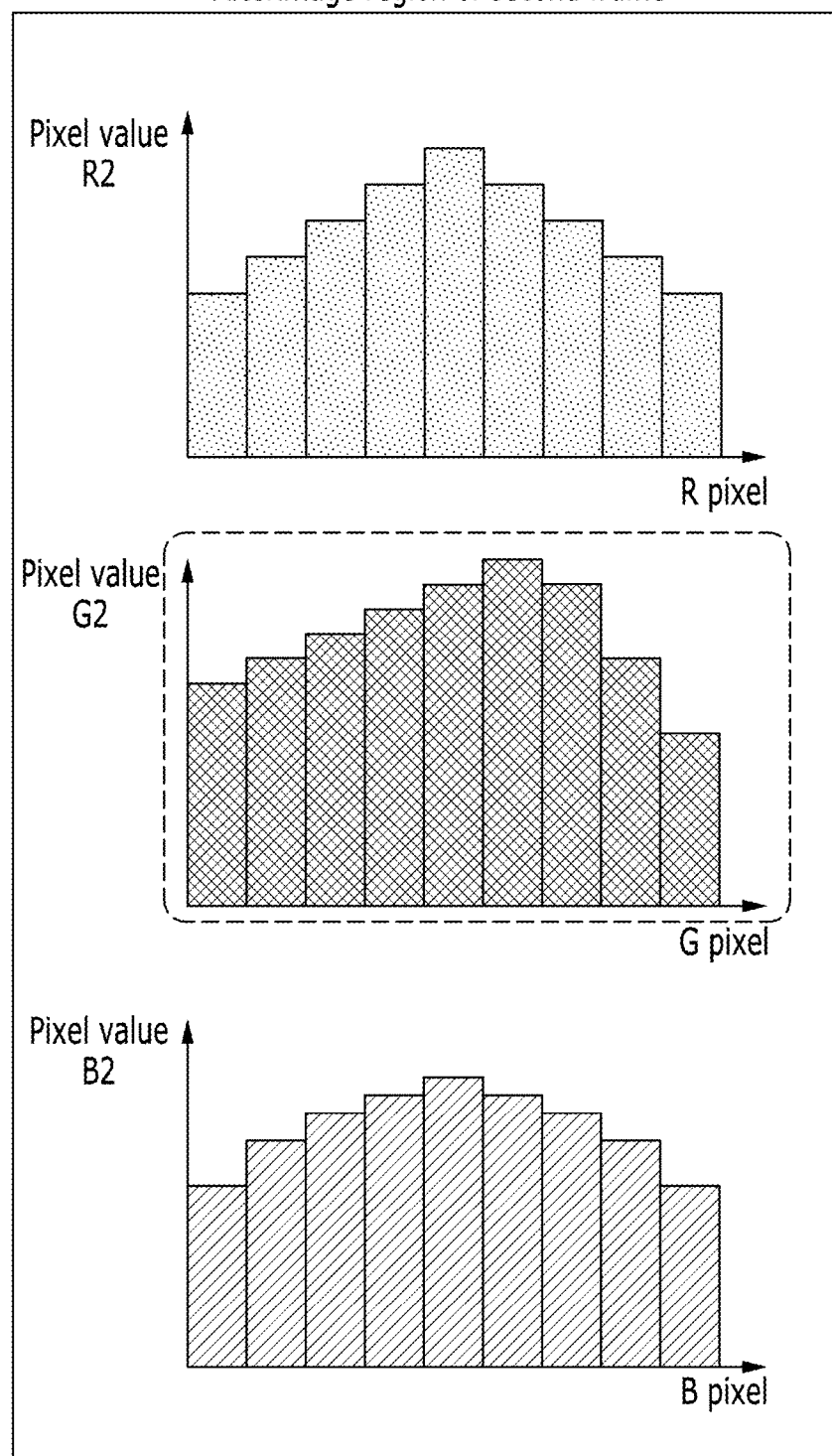
FIG. 15 is a graph showing each pixel value of an afterimage region in a second frame in a moving image processing apparatus according to some example embodiments, where a horizontal axis represents a pixel position and a vertical axis represents a pixel value.

FIG. 14 is a graph showing each pixel value of a candidate region 53 in a third frame 33 in a moving image processing apparatus 20 according to some example embodiments, where a horizontal axis represents a pixel position and a vertical axis represents a pixel value. FIG. 15 is a graph showing each pixel value of an afterimage region 52 in a second frame 32 in a moving image processing apparatus 20 according to some example embodiments, where a horizontal axis represents a pixel position and a vertical axis represents a pixel value. FIG. 14 and FIG. 15 both show pixel values of R pixels, G pixels, and B pixels.

No afterimage ZA occurs in the R pixels and B pixels in the second frame 32, and in the R pixels, the B pixels, and the G pixels in the third frame 33. It may be assumed that a ratio among the pixel value R2, the pixel value B2, and the pixel value G2 of the afterimage region 52 extracted in the second frame 32 is originally equal to a ratio among the pixel value R3, the pixel value B3, and the pixel value G3 of the candidate region 53 extracted in the third frame 33. Therefore, the pixel value G2 of the G pixel in the second frame 32 where the afterimage has occurred may be corrected, for example, to a pixel value G2c corrected in Equation 1.

$$G2c=\{R2\times(G3/R3)+B2\times(G3/B3)\}/2 \qquad \text{Equation 1}$$

The correction is not limited to Equation 1. In some example embodiments, when the pixel values R2 and R3 are greater than the pixel values B2 and B3 in the afterimage region 52 and the candidate region 53, Equation 2 may be used.

$$G2c=R2\times(G3/R3) \qquad \text{Equation 2}$$

In some example embodiments, when the pixel values B2 and B3 are greater than the pixel values R2 and R3, Equation 3 may be used.

$$G2c=B2\times(G3/B3) \qquad \text{Equation 3}$$

In addition, the method of calculating the pixel value G2c is not limited to Equations 1 to 3, and may include a method of using any of the pixel value R3, the pixel value B3, and the pixel value G3 of the third frame 33, and the pixel value R2 and the pixel value B2 of the second frame 32 are used.

Accordingly, an afterimage region correction unit 27 may correct the image data of the afterimage region 52 extracted from the second frame 32 based on the image data of the candidate region 53 extracted from the third frame 33. Specifically, the afterimage region correction unit 27 may correct the pixel value G2 of the afterimage region 52 based on at least one of the pixel value R3, the pixel value B3, and the pixel value G3 of the candidate region 53, and the pixel value R3 and the pixel value B3 of the afterimage region 52.

Moving Image Processing Method

Next, a moving image processing method is described as an operation of a moving image processing apparatus 20 according to some example embodiments.

Figure 16:
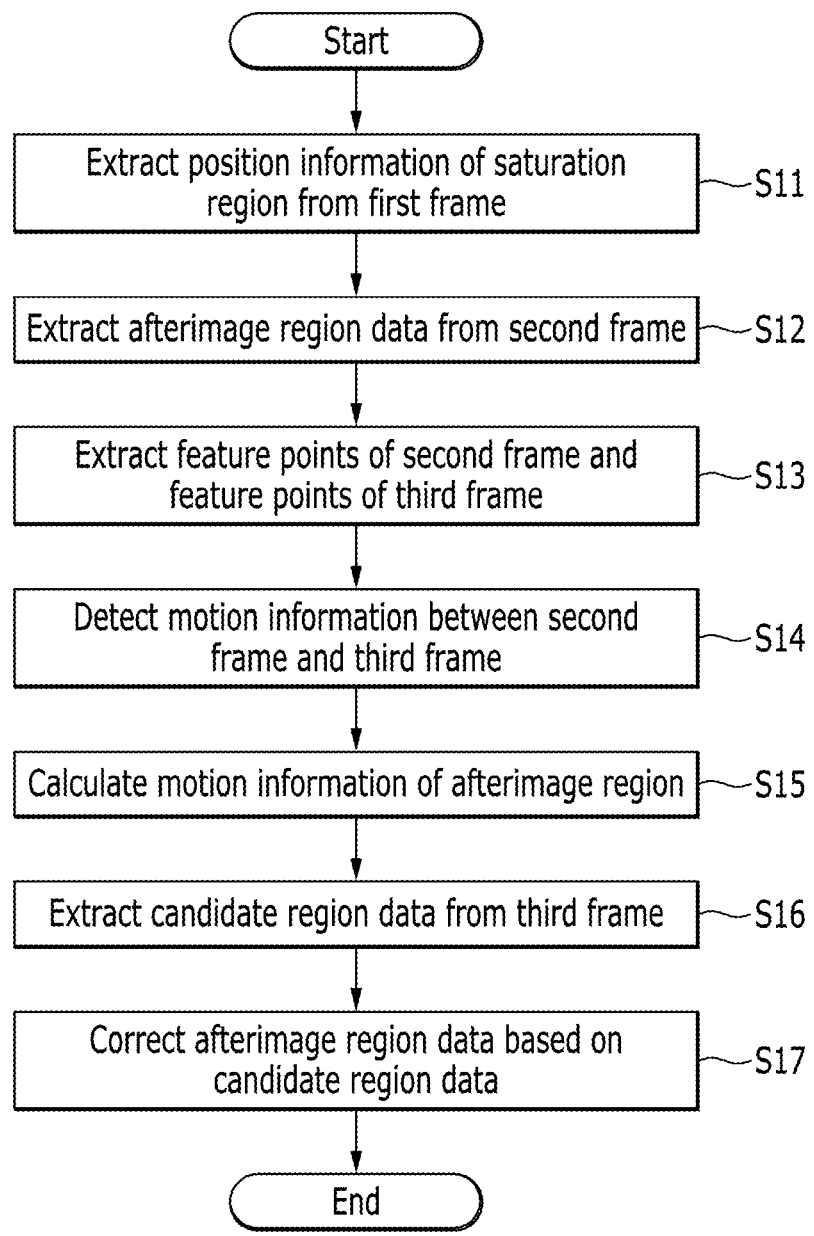
FIG. 16 is a flowchart showing a moving image processing method according to some example embodiments.

FIG. 16 is a flowchart showing a moving image processing method according to some example embodiments. Said method may be implemented by any example embodiments of the imaging apparatus 1, including the moving image processing apparatus 20 and/or the image sensor 10.

Referring to FIG. 16, a moving image processing apparatus 20 extracts position information of a saturation region 51 from a first frame 31 at step S11. In some example embodiments, a position information extraction unit 21 may extract the position information on a frame of the saturation region 51 from the first frame 31, in which where the saturation region 51 including a plurality of pixels having received spot light SP causing an afterimage ZA is formed (e.g., a limited portion of pixels having at least a threshold pixel value that is associated with an afterimage being formed in a subsequent frame elapsed from the first frame 31), among a plurality of frames 30 including the first frame 31, a second frame 32 that has elapsed from the first frame 31, and a third frame 33 that has elapsed from the second frame 32, forming a moving image 40. In some example embodiments, in step S11, the saturation region 51 may include a plurality of neighboring (e.g., adjacent) R pixels, B pixels, and G pixels in which a pixel value represents a maximum value (e.g., the pixel values of such neighboring pixels may be at least a maximum value.

Next, e.g., in response to detection and/or extraction of the saturation region 51 in the first frame 31, the moving image processing apparatus 20 extracts afterimage region data from the second frame 32 at step S12. In some example embodiments, an afterimage region extraction unit 22 may extract image data of an afterimage region 52 from the second frame 32, the after image region 52 corresponding to the position information of the saturation region 51 formed in the first frame 31.

Next, the moving image processing apparatus 20 extracts feature points of the second frame 32 (e.g., one or more first feature points of an image in the second frame 32) and feature points of the third frame 33 (e.g., one or more second feature points of a separate image in the third frame 33) at step S13. In some example embodiments, a feature point extraction unit 23 may extract the feature points 32a to 32i of an image in the second frame 32 and the feature points 33a to 33i of an image (e.g., a separate image) in the third frame 33.

Next, the moving image processing apparatus 20 detects motion information V1 (e.g., first motion information) indicating motion between the second frame 32 and the third frame 33 at step S14. In some example embodiments, a motion information detection unit 24 may detect the motion information V1 between the second frame 32 and the third frame 33 based on performing matching between the feature points 32a to 32i and the feature points 33a to 33i.

Next, the moving image processing apparatus 20 calculates motion information V2 (e.g., second motion information) of the afterimage region 52 at step S15. In some example embodiments, a motion information calculation unit 25 may calculate the motion information V2 of the afterimage region 52 based on the detected motion information V1.

For example, the motion information calculation unit 25 may calculate the motion information V2 based on the motion information V1 of the feature point in the vicinity of the afterimage region 52. In some example embodiments, the motion information calculation unit 25 may calculate the motion information V2 based on a plurality of motion information V1 of a plurality of feature points around the afterimage region 52. For example, the motion information calculation unit 25 may calculate the motion information V2 based on a weighted average according to a distance from the center of the afterimage region 52 to each of the feature points. For example, the motion information calculation unit 25 may calculate the motion information V2 based on a weighted average of the plurality of motion information V1 by using the distance from the center of the afterimage region 52 to each of the feature points as a weight.

Next, the moving image processing apparatus 20 extracts candidate region data from the third frame 33 at step S16. In some example embodiments, a candidate region extraction unit 26 may extract as the candidate region data image data of the candidate region 53 that is matched to the afterimage region 52 based on the calculated motion information V2 in the third frame 33.

Next, the moving image processing apparatus 20 corrects the afterimage region data in the second frame 32, thereby adjusting pixel values of at least some pixels in the second frame 32, based on the candidate region data at step S17. In some example embodiments, an afterimage region correction unit 27 may correct the afterimage region data based on the candidate region data.

In step S17, the afterimage region correction unit 27 may, for example, correct a pixel value G2 of the afterimage region data, based on a ratio among a pixel value R3 representing luminance of red light received by a R pixel, a pixel value B3 representing luminance of blue light received by a B pixel, and a pixel value G3 representing luminance of green light received by a G pixel in the candidate region data, for example, a ratio of the pixel value R3 and the pixel value G3 and a ratio of the pixel value B3 and the pixel value G3, and a ratio of a pixel value R2 representing luminance of red light received by a R pixel and a pixel value B2 representing luminance of blue light received by a B pixel in the afterimage region data. Accordingly, the plurality of frames 30 forming the moving image 40 are processed to output the moving image 40.

In some example embodiments, the moving image processing method may further include a frame generation step of outputting a plurality of frames from an image sensor 10. In some example embodiments, the image sensor 10 may include a plurality of first pixels configured to photoelectrically convert first light, a plurality of second pixels configured to photoelectrically convert second light having a different wavelength from the first light, and a plurality of third pixels configured to photoelectrically convert third light having a different wavelength from the first light and the second light. The third pixels may be provided on a side in which the first light and the second light enter compared with the first pixels and the second pixels.

In some example embodiments, in the frame generation step, the first pixels may photoelectrically convert red light, the second pixels may photoelectrically convert blue light, and the third pixels may photoelectrically convert green light. In some example embodiments, a photoelectric conversion member of the first pixels and the second pixels may include silicon, and a photoelectric conversion member of the third pixels may include an organic semiconductor.

Figure 17:
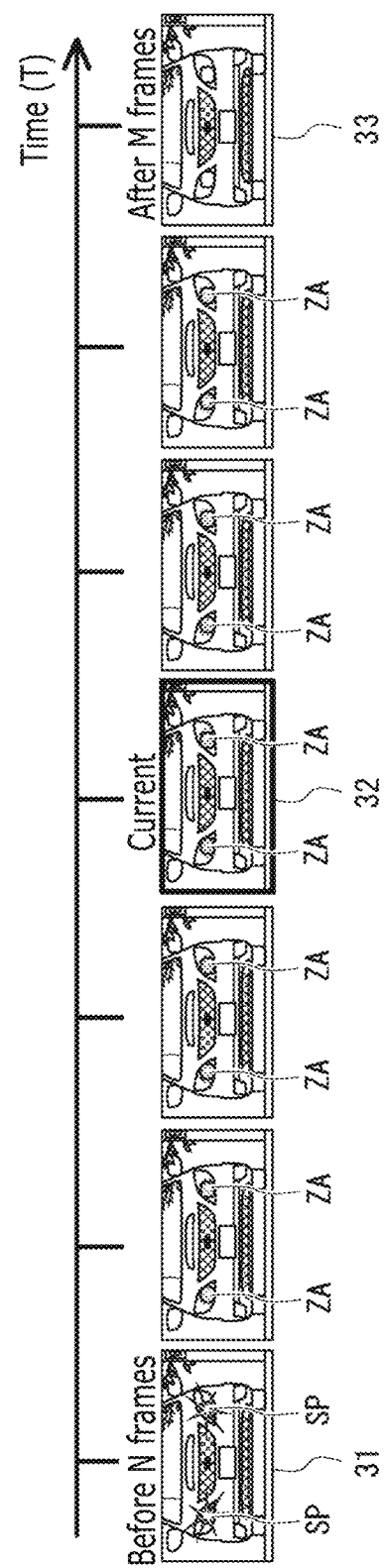
FIG. 17 is a diagram showing a plurality of frames output by an image sensor in an imaging apparatus according to some example embodiments.

Next, some example embodiments are described. Some example embodiments correspond to an example where the frame rate is large. FIG. 17 is a diagram showing a plurality of frames 30 output by an image sensor 10 in an imaging apparatus 1 according to some example embodiments.

For example, when a frame rate is 30 fps (frame per second), even if an afterimage ZA occurs on a frame 30 output by the image sensor 10, a moving image processing apparatus 20 may remove the afterimage ZA in a next frame 30. That is, the moving image processing apparatus 20 may process a first frame 31, a second frame 32, and a third frame 33 so that they are continuous.

However, as shown in FIG. 17, when the frame rate is greater than 30 fps, there may be a plurality of frames 30 with the influence of the afterimage ZA between the first frame 31 and the second frame 32 or between the second frame 32 and the third frame 33. For example, when spot light SP is received in the first frame 31 before N frame than the second frame 32, the afterimage ZA may disappear in the third frame 33 after M frame than the second frame 32. For example, in a case of M=3 and N=3, the frame rate may correspond to 180 fps.

In this case, the moving image processing apparatus 20 may remove the afterimage ZA by maintaining image data of (M+N+1) frames 30. In some example embodiments, each frame of the (M+N−1) frames between the first frame 31 and the third frame 33 may be corrected as the second frame 32. In this case, the number of frames between the first frame 31 having received the spot light SP and the third frame 33 in which the afterimage ZA disappears may be set in advance, or may be determined from a dummy moving image 40.

Next, some example embodiments are described. Some example embodiments correspond to an example in which a position of an object on a frame 30 moves between a first frame 31 and a third frame 33.

Figure 18:
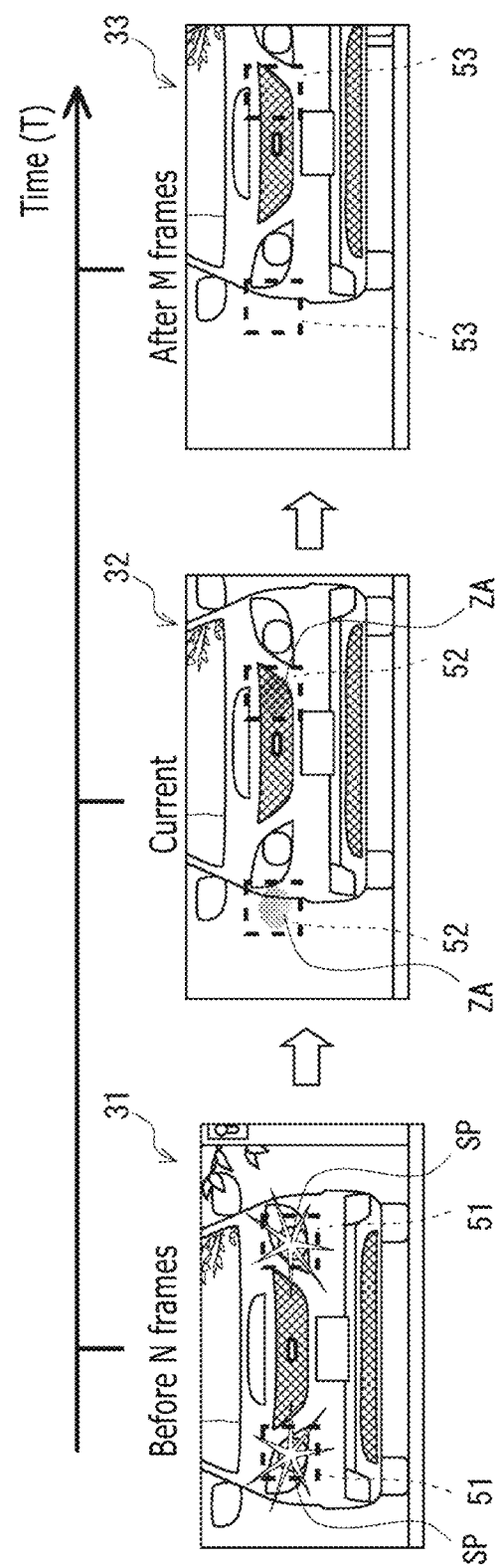
FIG. 18 is a diagram showing a plurality of frames output by an image sensor in an imaging apparatus according to yet some example embodiments.

FIG. 18 is a diagram showing a plurality of frames 30 output by an image sensor 10 in an imaging apparatus 1 according to some example embodiments. As shown in FIG. 18, a position of a vehicle on the frame 30 is moving in a right direction between a first frame 31 and a third frame 33, Accordingly, a position of a headlight on the frame 30 is also moving in the right direction.

The first frame 31 includes a saturation region 51 including a plurality of pixels having received spot light SP causing an afterimage ZA. A position information extraction unit 21 extracts position information on a frame of the saturation region 51.

An afterimage region extraction unit 22 extracts an afterimage region 52 corresponding to the position information of the saturation region 51 from a second frame 32. Since the position of the headlight moves in the right direction in the second frame 32, the afterimage region 52 does not include the headlight.

A candidate region extraction unit 26 extracts a candidate region 53 matched to the afterimage region 52 from the third frame 33 based on the motion information V2 calculated according to the above-described method. In some example embodiments, the moving image processing apparatus 20 may extract the afterimage region 52 whose position corresponds to the saturation region 51. Then, the moving image processing apparatus 20 may extract the candidate region 53 corresponding to the afterimage region 52 as the object. Therefore, even when the position of the object on the frame moves between the first frame 31 and the third frame 33, the moving image processing apparatus 20 may correct the afterimage region 52 including the afterimage ZA based on the candidate region 53.

Next, the effects of some example embodiments are described. A moving image processing apparatus 20 according to some example embodiments may correct an afterimage region 52 corresponding to a saturation region 51 having received spot light SP based on a candidate region 53 including no afterimage ZA, so that a green afterimage ZA generated after strong light such as headlight or sunlight is extinguished can be removed. Accordingly, an image quality of a moving image 40 can be improved.

In some example embodiments, when the afterimage region 52 is corrected, a pixel value G2 in the afterimage region 52 may be corrected based on a ratio among pixel values R3 and B3 and a pixel value G3 in the candidate region 53, and pixel values R2 and B2 in the afterimage region 52. Therefore, the green afterimage ZA of the afterimage region 52 can be precisely removed.

As a method of removing the afterimage ZA, a method of using the number of carriers generated in pixels on a frame 30 may be considered. This method first calculates the number of carriers generated in the respective pixels in the first frame 31 having received the spot light SP. The number of residual carriers is theoretically calculated from the number of generated carriers by using the characteristic of the photoelectric conversion member. The number of residual carriers is the number of carriers corresponding to the afterimage ZA. Next, the number of residual carriers is subtracted from the number of carriers in the second frame 32 in which the afterimage ZA occurs.

In this case, the actual image is not imaged to measure the luminance of the spot light SP so that a region corresponding to the spot light SP is saturated and expressed as a maximum value of a dynamic range. Therefore, since the region of the spot light SP is saturated, the number of residual carriers is estimated to be lower than the actual number, and the number of residual carriers cannot be accurately calculated from the number of generated carriers. Therefore, even if the number of residual carriers is subtracted from the number of carriers in the second frame 32 where the afterimage ZA occurs, the afterimage ZA cannot be precisely removed.

On the other hand, in a moving image processing method according to some example embodiments, since the afterimage region 52 of the second frame 32 where the afterimage ZA occurs is corrected based on the candidate region 53 of the third frame 33, it is not necessary to calculate the number of carriers. Therefore, the afterimage ZA can be precisely removed and the image quality can be improved.

In yet some example embodiments, the moving image processing method described above may be executed by a moving image processing program on a computing device, which is also referred to herein as an electronic device.

In some example embodiments, the moving image processing program (a computer program) to be executed by the computing device may be stored in a recording medium. The moving image processing program may configure the computing device to extract position information of a saturation region from a first frame in which the saturation region including a plurality of pixels having received spot light causing an afterimage is formed, among a plurality of frames forming a moving image and including the first frame, a second frame elapsed from the first frame, and a third frame elapsed from the second frame, extract as afterimage region data image data of an afterimage region corresponding to the position information of the saturation region from the second frame, extract a first feature point of an image in the second frame and a second feature point of an image in the third frame, detect first motion information between the second frame and the third frame by performing matching between the first feature point and the second feature point, calculate second motion information of the afterimage region based on the detected first motion information, extract as candidate region data image data of a candidate region that is matched to the afterimage region in the third frame based on the calculated second motion information, and correct the afterimage region data based on the candidate region data.

Although some example embodiments of the present inventive concepts have been described in detail above, the scope of the present inventive concepts is not limited thereto, and various modifications and improvements of those skilled in the art using the basic concept of the present inventive concepts defined in the following claims are also provided. It belongs to the scope of rights.

What is claimed is:

1. A moving image processing apparatus, comprising:
   processing circuitry configured to
   extract position information of a saturation region from a first frame in which the saturation region is formed, the saturation region including a limited plurality of pixels each having at least a threshold pixel value that is associated with an afterimage being formed in a subsequent frame elapsed from the first frame, wherein the first frame is among a plurality of frames forming a moving image, the plurality of frames including the first frame, a second frame elapsed from the first frame, and a third frame elapsed from the second frame;
   extract, as afterimage region data, image data of an afterimage region from the second frame, the afterimage region corresponding to the position information of the saturation region formed in the first frame;
   extract a first feature point of an image in the second frame and a second feature point of a separate image in the third frame;
   detect first motion information indicating motion between the second frame and the third frame based on performing matching between the first feature point and the second feature point;
   calculate second motion information of the afterimage region based on the first motion information;
   extract, as candidate region data, image data of a candidate region, in the third frame, that is matched to the afterimage region, the image data of the candidate region being extracted based on the second motion information; and
   correct the afterimage region data in the second frame, based on the candidate region data.

2. The moving image processing apparatus of claim 1, wherein
   the plurality of frames are output from an image sensor including a plurality of pixels, the limited plurality of pixels being a limited portion of the plurality of pixels, and
   the plurality of pixels include
   a plurality of first pixels configured to photoelectrically convert a first light;
   a plurality of second pixels configured to photoelectrically convert a second light having a different wavelength from the first light; and
   a plurality of third pixels that is proximate to an incident light side of the image sensor, in relation to the plurality of first pixels and the plurality of second pixels, the plurality of third pixels configured to photoelectrically convert a third light having a different wavelength from the first light and the second light.

3. The moving image processing apparatus of claim 2, wherein
   the processing circuitry is configured to
   determine a ratio among a first pixel value representing luminance of the first light received by the first pixels in the candidate region data, a second pixel value representing luminance of the second light received by the second pixels in the candidate region data, and a third pixel value representing luminance of the third light received by the third pixels in the candidate region data, and
   correct a third pixel value representing luminance of the third light received by the third pixels in the afterimage region data based on the ratio, a first pixel value representing luminance of the first light received by the first pixels in the afterimage region data, and a second pixel value representing luminance of the second light received by the second pixels in the afterimage region data.

4. The moving image processing apparatus of claim 2, wherein
   the processing circuitry is configured to, in response to a determination that a first pixel value representing luminance of the first light received by the first pixels in the candidate region data and a first pixel value representing luminance of the first light received by the first pixels the afterimage region data are greater than a second pixel value representing luminance of the second light received by the second pixels in the candidate region data and a second pixel value representing luminance of the second light received by the second pixels in the afterimage region data,
   correct a third pixel value representing luminance of the third light received by the third pixels in the afterimage region data based on
   a ratio, of the first pixel value representing luminance of the first light received by the first pixels in the candidate region data and a third pixel value representing luminance of the third light received by the third pixels in the candidate region data, and
   the first pixel value representing luminance of the first light received by the first pixels in the afterimage region data.

5. The moving image processing apparatus of claim 2, wherein
   the processing circuitry is configured to, in response to a determination that a first pixel value representing luminance of the first light received by the first pixels in the candidate region data and a first pixel value representing luminance of the first light received by the first pixels the afterimage region data is less than a second pixel value representing luminance of the second light received by the second pixels in the candidate region data and a second pixel value representing luminance of the second light received by the second pixels in the afterimage region data,
   correct a third pixel value representing luminance of the third light received by the third pixels in the afterimage region data, based on
   a ratio, of the second pixel value representing luminance of the second light received by the second pixels in the candidate region data and a third pixel value representing luminance of the third light received by the third pixels in the candidate region data, and the second pixel value representing luminance of the second light received by the second pixels in the afterimage region data.

6. The moving image processing apparatus of claim 2, wherein the saturation region includes a limited plurality of adjacent first pixels, second pixels, and third pixels corresponding to separate, respective pixel values that are each at least a maximum value, among the plurality of first pixels, the plurality of second pixels, and the plurality of third pixels.

7. The moving image processing apparatus of claim 2, wherein
the first feature point includes a feature point within a threshold proximity of the afterimage region, and
the processing circuitry is configured to calculate the second motion information based on the first motion information corresponding to the feature point within the threshold proximity of the afterimage region.

8. The moving image processing apparatus of claim 2, wherein
the first feature point includes a plurality of feature points at least partially surrounding the afterimage region,
the first motion information includes a plurality of first motion information corresponding to separate, respective feature points of the plurality of feature points, and
the processing circuitry is configured to calculate the second motion information based on the plurality of first motion information.

9. The moving image processing apparatus of claim 8, wherein the processing circuitry is configured to calculate the second motion information based on a weighted average of the plurality of first motion information, the weighted average calculated based on using a distance from a center of the afterimage region to each of the plurality of feature points as a weight.

10. The moving image processing apparatus of claim 2, wherein the first light includes red light, the second light includes blue light, and the third light includes green light.

11. The moving image processing apparatus of claim 2, wherein a photoelectric conversion member of the first pixels and second pixels includes silicon, and a photoelectric conversion member of the third pixels includes an organic semiconductor.

12. A method of processing a moving image, the method comprising:
extracting position information of a saturation region from a first frame in which the saturation region is formed, the saturation region including a limited plurality of pixels each having at least a threshold pixel value that is associated with an afterimage being formed in a subsequent frame elapsed from the first frame, wherein the first frame is among a plurality of frames forming a moving image, the plurality of frames including the first frame, a second frame elapsed from the first frame, and a third frame elapsed from the second frame;
extracting as afterimage region data, image data of an afterimage region from the second frame, the afterimage region corresponding to the position information of the saturation region formed in the first frame;
extracting a first feature point of an image in the second frame and a second feature point of a separate image in the third frame;
detecting first motion information indicating motion between the second frame and the third frame based on performing matching between the first feature point and the second feature point;
calculating second motion information of the afterimage region based on the first motion information;
extracting, as candidate region data, image data of a candidate region, in the third frame, that is matched to the afterimage region, the image data of the candidate region being extracted based on the second motion information; and
correcting the afterimage region data in the second frame, based on the candidate region data.

13. The method of claim 12, further comprising:
outputting the plurality of frames from an image sensor including a plurality of pixels the limited plurality of pixels being a limited portion of the plurality of pixels,
wherein the plurality of pixels include
a plurality of first pixels configured to photoelectrically convert a first light;
a plurality of second pixels configured to photoelectrically convert a second light having a different wavelength from the first light; and
a plurality of third pixels that is proximate to an incident light side of the image sensor, in relation to the plurality of first pixels and the plurality of second pixels, the plurality of third pixels configured to photoelectrically convert a third light having a different wavelength from the first light and the second light.

14. The method of claim 13, wherein correcting the afterimage region data includes,
determining a ratio among a first pixel value representing luminance of the first light received by the first pixels in the candidate region data, a second pixel value representing luminance of the second light received by the second pixels in the candidate region data, and a third pixel value representing luminance of the third light received by the third pixels in the candidate region data, and
correcting a third pixel value representing luminance of the third light received by the third pixels in the afterimage region data based on the ratio, a first pixel value representing luminance of the first light received by the first pixels in the afterimage region data, and a second pixel value representing luminance of the second light received by the second pixels in the afterimage region data.

15. The method of claim 13, wherein the saturation region includes a limited plurality of adjacent first pixels, second pixels, and third pixels corresponding to separate, respective pixel values that are each at least a maximum value, among the plurality of first pixels, the plurality of second pixels, and the plurality of third pixels.

16. The method of claim 13, wherein
the first feature point includes a feature point within a threshold proximity of the afterimage region, and
the calculating the second motion information includes calculating the second motion information based on the first motion information corresponding to the feature point within the threshold proximity of the afterimage region.

17. The method of claim 13, wherein
the first feature point includes a plurality of feature points at least partially surrounding the afterimage region, the first motion information includes a plurality of first motion information corresponding to separate, respective feature points of the plurality of feature points, and the calculating the second motion information includes calculating the second motion information based on the plurality of the first motion information.

18. The method of claim 13, wherein the first light includes red light, the second light includes blue light, and the third light includes green light.

19. The method of claim 13, wherein a photoelectric conversion member of the first pixels and second pixels includes silicon, and a photoelectric conversion member of the third pixels includes an organic semiconductor.

20. A computer program stored on a non-transitory computer-readable medium, wherein the computer program is executable by a computing device to cause the computing device to:

extract position information of a saturation region from a first frame in which the saturation region is formed, the saturation region including a limited plurality of pixels each having at least a threshold pixel value that is associated with an afterimage being formed in a subsequent frame elapsed from the first frame, wherein the first frame is among a plurality of frames forming a moving image, the plurality of frames including the first frame, a second frame elapsed from the first frame, and a third frame elapsed from the second frame;

extract, as afterimage region data, image data of an afterimage region from the second frame, the afterimage region corresponding to the position information of the saturation region formed in the first frame;

extract a first feature point of an image in the second frame and a second feature point of a separate image in the third frame;

detect first motion information indicating motion between the second frame and the third frame based on performing matching between the first feature point and the second feature point;

calculate second motion information of the afterimage region based on the first motion information;

extract as candidate region data, image data of a candidate region, in the third frame, that is matched to the afterimage region, the image data of the candidate region being extracted based on the second motion information; and correct the afterimage region data in the second frame, based on the candidate region data.

* * * * *